US 7,262,749 B2

(12) United States Patent
Koyama et al.

(10) Patent No.: US 7,262,749 B2
(45) Date of Patent: Aug. 28, 2007

(54) DISPLAY DEVICE AND METHOD OF DRIVING THE SAME

(75) Inventors: Jun Koyama, Kanagawa (JP); Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 640 days.

(21) Appl. No.: 10/785,809

(22) Filed: Feb. 24, 2004

(65) Prior Publication Data

US 2004/0164949 A1  Aug. 26, 2004

Related U.S. Application Data

(63) Continuation of application No. 10/040,084, filed on Oct. 26, 2001, now Pat. No. 6,697,057.

(30) Foreign Application Priority Data

Oct. 27, 2000  (JP)  ............................. 2000-328751

(51) Int. Cl.
*G09G 3/30* (2006.01)
*G09G 3/20* (2006.01)

(52) U.S. Cl. .................. 345/76; 345/211; 315/169.3

(58) Field of Classification Search ................. 345/78, 345/82, 211, 204, 76; 315/169.3
See application file for complete search history.

(56) References Cited

U.S. PATENT DOCUMENTS

| 5,821,701 | A | * | 10/1998 | Teggatz et al. | ............. | 315/307 |
| 6,362,798 | B1 | | 3/2002 | Kimura et al. | ................ | 345/55 |
| 6,376,934 | B1 | * | 4/2002 | DeLurio | ..................... | 307/125 |
| 6,528,951 | B2 | | 3/2003 | Yamazaki et al. | ....... | 315/169.3 |
| 6,548,960 | B2 | | 4/2003 | Inukai | ..................... | 315/169.3 |
| 2002/0000576 | A1 | | 1/2002 | Inukai | ........................ | 257/202 |
| 2002/0017643 | A1 | | 2/2002 | Koyama | ..................... | 257/59 |
| 2002/0053884 | A1 | | 5/2002 | Kimura | ................... | 315/169.3 |
| 2002/0105279 | A1 | | 8/2002 | Kimura | ................... | 315/169.3 |
| 2002/0140646 | A1 | | 10/2002 | Sato et al. | .................... | 345/82 |
| 2003/0090447 | A1 | | 5/2003 | Kimura | ....................... | 345/82 |

FOREIGN PATENT DOCUMENTS

JP  60-198872  10/1985

OTHER PUBLICATIONS

Tsutsui, T., et al, "Electroluminescence in Organic Thin Films," Photochemical Processes in Organized Molecular Systems, pp. 437-450, (1991).
Baldo, M.A. et al, "Highly Efficient Phosphorescent Emission from Organic Electroluminescent Devices," Nature, vol. 395, pp. 151-154, Sep. 10, 1998.
Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.
Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, 1999.

* cited by examiner

*Primary Examiner*—Dennis-Doon Chow
(74) *Attorney, Agent, or Firm*—Cook, Alex, McFarron, Manzo, Cummings & Mehler, Ltd.

(57) ABSTRACT

In a conventional EL display device, a general video signal (analog signal voltage) is sampled to be outputted to a source signal line and then inputted to a gate electrode of a driving TFT provided in each pixel. The drain current of the TFT is controlled to control the current flowing into an EL element, thereby adjusting the luminance. However, accurate gray scales cannot be obtained unless the video signal is converted before it is sampled and inputted to the source signal line since the drain current of the driving TFT does not correspond to the gate voltage of the driving TFT linearly. The invention solve this problem by converting an inputted analog signal voltage into a current, converting the current into the gate-source voltage of a correction TFT that has the same polarity as a driving TFT, supplying the gate-source voltage as a source line signal to a source signal line, and applying the source line signal to a gate electrode of the driving TFT. Thus an EL element can emit light at a luminance linearly corresponding to the inputted analog signal voltage.

8 Claims, 19 Drawing Sheets

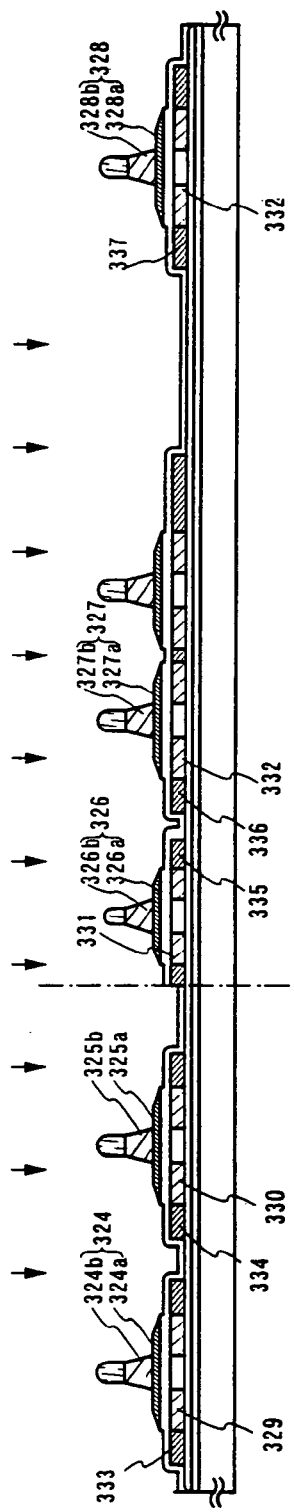
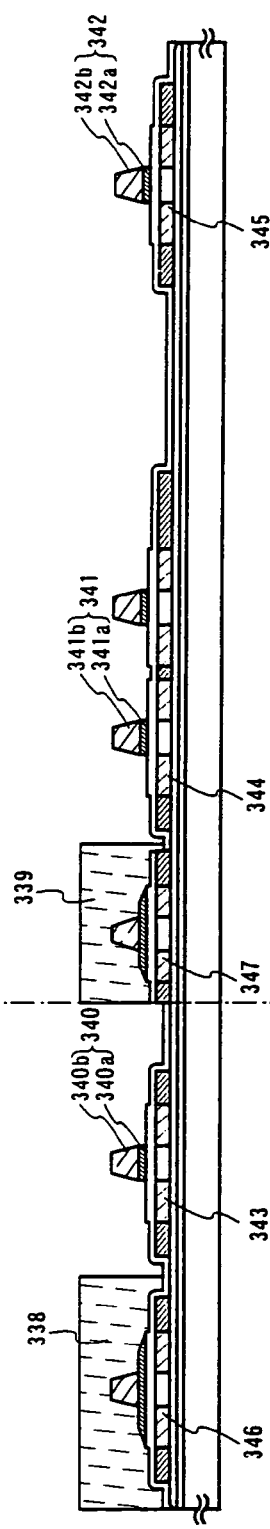
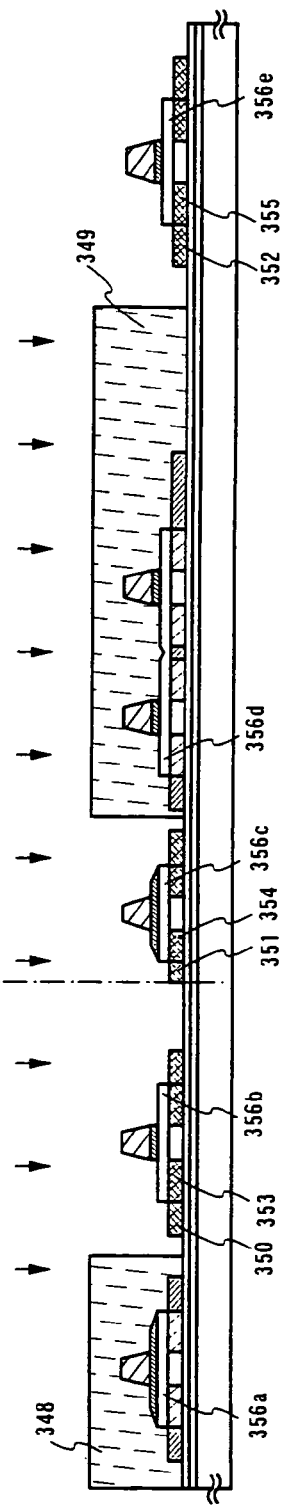
Fig. 15A
Fig. 15B
Fig. 15C

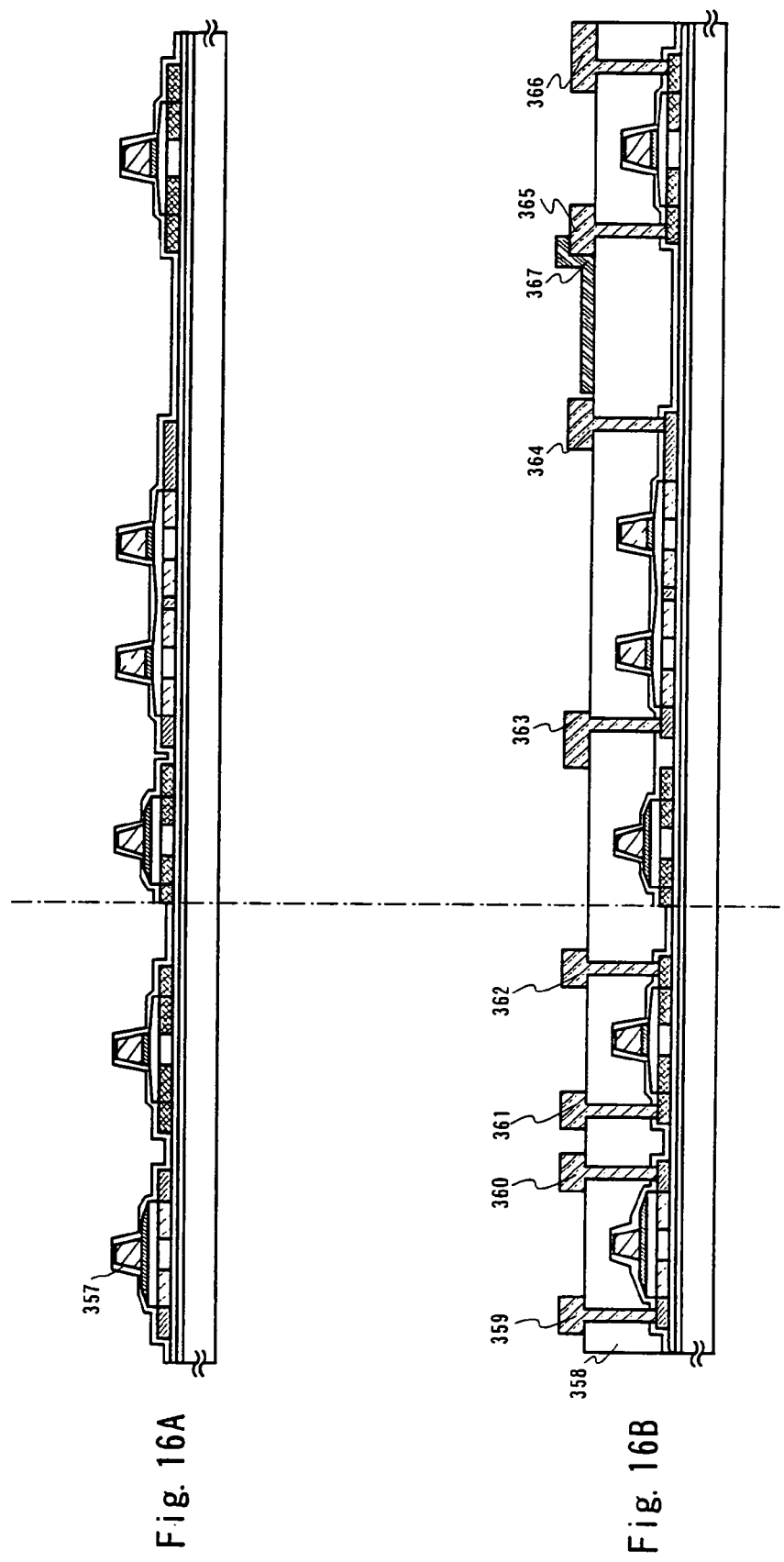

DISPLAY DEVICE AND METHOD OF DRIVING THE SAME

This application is a continuation of U.S. application Ser. No. 10/040,084, filed on Oct. 26, 2001 now U.S. Pat. No. 6,697,077.

BACKGROUND OF THE INVENTION

1. Field of the Invention

The present invention relates to an active matrix EL display device in which each pixel has TFTs (thin film transistors) and an EL element. Specifically, the invention relates to an active matrix EL display device of analog gray scale system in which gray scales are reflection of analog changes in amount of current flowing into EL elements.

In this specification, EL elements include those emit light from singlet excitation (fluorescence) and those emit light from triplet excitation (phosphorescence) both.

2. Description of the Related Art

With recent flood of data communication, demands for data communication equipment are increasing. In data communication equipment, display devices for displaying images are indispensable. The display devices that are attracting attention are EL display devices using an EL element that is a self-luminous element.

As display units larger in size and higher in definition are needed in data communication equipment, active matrix display devices in which each pixel has TFTs are becoming the main stream display devices.

FIG. 4 is a block diagram of an active matrix EL display device. A source signal line driving circuit 402 and a gate signal line driving circuit 403 are arranged in the periphery of a pixel portion 401. A signal outputted from the source signal line driving circuit 402 is inputted to source signal lines S1 to Sx to be sent to pixels. A signal outputted from the gate signal line driving circuit 403 is inputted to gate signal lines G1 to Gy to be sent to pixels. Power supply lines (power lines) V1 to Vx are arranged in parallel to the source signal lines to supply current to pixels.

As one way to reduce the size of a display device as well as manufacture cost, sometimes a pixel portion and a driving circuit portion (composed of a source signal line driving circuit and a gate signal line driving circuit) are formed on the same substrate. In this case, a polycrystalline semiconductor film is used to form TFTs that constitute the pixel portion and the driving circuit portion.

This can be applied to the active matrix EL display device of FIG. 4, and an example of the pixel structure thereof is shown in FIG. 5.

A switching TFT 504 has a gate electrode connected to a gate signal line G that is one of the gate signal lines G1 to Gy. The switching TFT also has a source region and a drain region one of which is connected to a source signal line S that is one of the source signal lines S1 to Sx and the other of which is connected to one of gate electrodes of a capacitor 505 and to a gate electrode of an EL driving TFT 506. Of two electrodes of the capacitor 505, one that is not connected to the switching TFT 504 is connected to a power supply line V that is one of the power supply lines V1 to Vx. The EL driving TFT 506 has a source region and a drain region one of which is connected to the power supply line V and the other of which is connected to an EL element 507.

In a pixel whose gate signal line G is selected, the signal electric potential of the source signal line S is inputted to one of the electrodes of the capacitor 505 through the switching TFT 504 that has been turned conductive. The voltage between the electrodes of the capacitor 505 is applied to the gate electrode of the EL driving TFT 506. In accordance with this voltage applied, a current flows from the power supply line V through the EL driving TFT 506 into the EL element 507 and causes the EL element 507 to emit light.

The luminance of light emitted from the EL element 507 is almost in proportion with the amount of current flowing into the EL element 507. Therefore gray scales are obtained by changing the amount of current flowing into the EL element 507.

In the display device shown in FIG. 5, the current flowing into the EL element 507 is inputted from the power supply line V through the EL driving TFT 506. The relation between a drain-source voltage $V_{DS}$ of a TFT and a drain current $I_D$ of the TFT in general is as shown in FIG. 8.

FIG. 8 is a graph showing plural $I_D$ curves obtained by varying the value of a gate voltage $V_{GS}$. The drain current $I_D$ becomes larger as the absolute value of the difference between the gate voltage $V_{GS}$ and a threshold voltage $V_{th}$ of the EL driving TFT 506 ($|V_{GS}-V_{th}|$) becomes larger, in other words, as the absolute value $|V_{GS}|$ of the gate voltage $V_{GS}$ becomes larger.

When the absolute value $|V_{GS}-V_{th}|$ of the difference between the gate voltage $V_{GS}$ and the threshold voltage $V_{th}$ of the EL driving TFT 506 is larger than the absolute value $|V_{DS}|$ of the drain-source voltage $V_{DS}$, the TFT operates in a linear range. On the other hand, the TFT operates in a saturation range when $|V_{GS}-V_{th}|$ is equal to or smaller than the absolute value $|V_{DS}|$ of the drain-source voltage $V_{DS}$.

The EL driving TFT 506 generally operates in the saturation range where the absolute value $|V_{DS}|$ of the drain-source voltage $V_{DS}$ is equal to or greater than the absolute value $|V_{GS}-V_{th}|$ of the difference between the gate voltage $V_{GS}$ and the threshold voltage $V_{th}$ of the EL driving TFT 506.

In the saturation range, the drain current $I_D$ of the TFT is in proportion to the second power of the gate voltage $V_{GS}$ as shown in the following Equation 1.

$$I_D = (1/2)\mu_0 C_0 (W^2/L^2)(V_{GS}-V_{th})^2 \qquad \text{(Equation 1)}$$

wherein, $V_{th}$ represents the threshold voltage, $\mu_0$ represents the effective mobility, $C_0$ represents the capacitance of a gate insulating film per unit area, W represents the gate width, and L represents the gate length.

In accordance with this equation, the electric potential to be inputted to the source signal line S is changed such that the TFT receives a gate voltage in proportion to the square root of the desired amount current to be inputted to the EL element 507. In this way, the EL element is caused to emit light of desired luminance.

When an image is to be displayed, an electric potential according to a desired gray scale is calculated by Equation 1 and is inputted to the source signal line.

However, a video signal inputted from the external generally has an analog electric potential that changes linearly with respect to the luminance obtained. Therefore accurate gray scales cannot be obtained when a video signal supplied from the external is inputted to the signal line as it is.

There is a countermeasure in which an external correction circuit converts the video signal into a drive signal in advance to suit the characteristics of the EL driving TFT and then the signal is sampled by the source signal line driving circuit and outputted to pixels to obtain a given gray scale.

This measure, however, complicates the operation since it requires video signal processing as above before the signal is inputted to the source signal line driving circuit. Furthermore, the measure needs the correction circuit in addition to the source signal line driving circuit to obstruct reduction in size of the display device.

Accordingly, a method has to be found which makes it possible to obtain a given gray scale when a video signal is inputted directly to the source signal line driving circuit.

SUMMARY OF THE INVENTION

The present invention has been made in view of the above, and an object of the present invention is therefore to provide a display device having a source signal line driving circuit that makes a current flowing through an EL element of a pixel portion linearly correspond to a video signal inputted from the external and then sampled.

A given gray scale thus can readily be obtained when a video signal is inputted directly.

The structure of the present invention will be shown below.

According to the present invention, there is provided a display device having in each pixel an EL element, a source signal line, and a driving TFT for driving the EL element, the device characterized by comprising:

means for converting an inputted analog signal voltage into a current;

means for converting the current into a gate-source voltage of a TFT that has the same polarity as the driving TFT;

means for supplying the gate-source voltage as a source line signal to the source signal line; and means for supplying the source line signal to a gate electrode of the driving TFT, and converting the source line signal into a current in the driving TFT to drive the EL element.

According to the present invention, there is provided a display device having in each pixel a source signal line, an EL driving TFT, a power supply line, and an EL element, the source signal line inputting its signal voltage to a gate electrode of the EL driving TFT, the power supply line supplying a current to the EL element through the source-drain of the EL driving TFT, the device characterized in that:

a correction TFT having the same polarity as the EL driving TFT is provided;

an analog signal voltage sampled is converted into a signal current linearly corresponding thereto;

the signal current flows into the source-drain of the correction TFT to output, to the source signal line, a drive voltage obtained by adding the gate-source voltage of the correction TFT to a reference electric potential; and the gate-source voltage of the EL driving TFT is substantially equal to the gate-source voltage of the correction TFT when the electric potential of the power supply line is set as the reference electric potential.

According to the present invention, there is provided a display device having in each pixel a source signal line, an EL driving TFT, a power supply line, and an EL element, the source signal line inputting its signal voltage to a gate electrode of the EL driving TFT, the power supply line supplying a current to the EL element through the source-drain of the EL driving TFT, the device characterized in that:

a signal input line, a switch, a resistor, a correction TFT, and an operation amplifier are provided;

the correction TFT has the same polarity as the EL driving TFT;

the resistor has a first terminal and a second terminal;

the operation amplifier has a non-inversion input terminal, an inversion input terminal, and an output terminal;

the signal input line is connected to the first terminal of the resistor through the switch;

the second terminal of the resistor is connected to the inversion input terminal of the operation amplifier and to a source region or a drain region of the correction TFT;

of the source region and the drain region of the correction TFT, the one that is not connected to the inversion input terminal of the operation amplifier is connected to the output terminal of the operation amplifier and to the source signal line; and a gate electrode of the correction TFT is connected to the drain region or the source region of the correction TFT.

The display device may be characterized in that the electric potential of the non-inversion input terminal of the operation amplifier is equal to the electric potential of the power supply line.

The display device may be characterized in that a switching TFT is provided and that the source signal line is connected to a gate electrode of the EL driving TFT through the source-drain of the switching TFT.

The display device may be characterized in that a reset TFT is provided and that the reset TFT has a source region and a drain region one of which is connected to the output terminal of the operation amplifier and the other of which receives a given electric potential.

The present invention provides electronic equipment selected from a personal computer, a video camera, a head mounted display, an image reproducing device, and a portable information terminal, and characterized by comprising the display device described above.

BRIEF DESCRIPTION OF THE DRAWINGS

In the accompanying drawings:

FIGS. 15A to 15C are diagrams showing the process of manufacturing an EL display device according to the present invention;

FIGS. 16A and 16B are diagrams showing the process of manufacturing an EL display device according to the present invention;

DETAILED DESCRIPTION OF THE PREFERRED EMBODIMENTS

Embodiment Mode

The structure of the present invention will be described with reference to FIG. 1.

Figure 1:
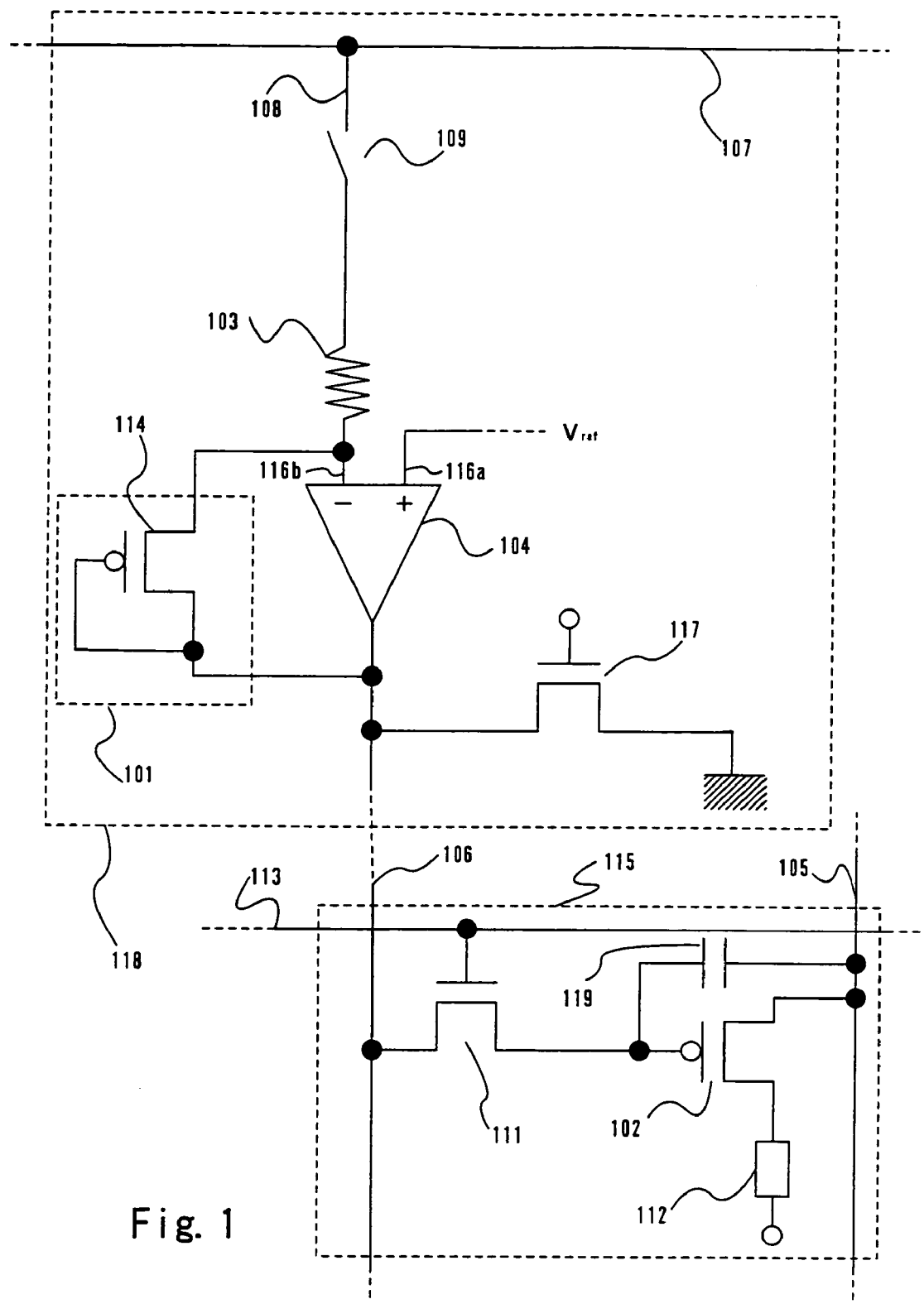
FIG. 1 is a circuit diagram showing the structure of an EL display device according to the present invention.

FIG. 1 shows a pixel 115 of an EL display device according to the present invention, as well as a portion 118 of a source signal line driving circuit for inputting a signal to the pixel.

The portion 118 of the source signal line driving circuit is composed of a diode 101, a resistor 103, an operation amplifier 104, an analog signal input line (signal input line) 107, a signal line 108, a switch (switching element) 109, and a reset TFT 117. The diode 101 consists of a correction TFT 114 in which a gate electrode and a drain region are electrically connected to each other.

The correction TFT 114 is a p-channel TFT. The reset TFT 117 may either be a p-channel TFT or an n-channel TFT.

The pixel is composed of an EL driving TFT 102, a power supply line (power line) 105, a source signal line 106, a gate signal line 113, a switching TFT 111, an EL element 112, and a capacitor 119. The EL driving TFT 102 is a p-channel TFT. The switching TFT 111 may either be a p-channel TFT or an n-channel TFT.

The EL driving TFT and the correction TFT are both p-channel TFTs here, but n-channel TFTs may be used for the EL driving TFT and the correction TFT. However, the EL driving TFT and the correction TFT have to have the same polarity and almost the same threshold voltage.

The analog signal input line 107 is connected to the signal line 108, which is connected through the switch 109 to the resistor 103. The resistor 103 is connected to an inversion input terminal 116b of the operation amplifier 104. The inversion input terminal 116b of the operation amplifier 104 is connected to a source region of the correction TFT 114. The operation amplifier 104 has a non-inversion input terminal 116a, to which a reference electric potential $V_{ref}$ is inputted. An output terminal of the operation amplifier 104 is connected to a drain region of the correction TFT 114 and to the source signal line 106. The reset TFT 117 has a source region and a drain region one of which is connected to the source signal line 106 and the other of which is grounded.

The switching TFT 111 has a gate electrode connected to the gate signal line 113. The switching TFT 111 also has a source region and a drain region one of which is connected to the source signal line 106 and the other of which is connected to a gate electrode of the EL driving TFT 102 and to one of two electrodes of the capacitor 119. The EL driving TFT 102 has a source region connected to the power supply line 105 and has a drain region connected to an anode of the EL element 112. The other electrode of the capacitor 119 is connected to the power supply line 105. A cathode of the EL element 112 is connected to a reference power line, which is not shown in FIG. 1.

A method of driving the display device shown in FIG. 1 will be described.

A signal voltage $V_{in}$ of a video signal inputted to the analog signal input line 107 is sampled when the switch 109 is opened or closed. The signal voltage is then inputted to the signal line 108.

The signal electric potential $V_{in}$ here is equal to or larger than the reference electric potential $V_{ref}$. A signal having a greater $V_{in}$ value represents a higher luminance.

The inversion input terminal 116b and the output terminal of the operation amplifier 104 are connected to each other through the diode 101. Therefore the electric potential of the inversion input terminal 116b is the same as the electric potential of the non-inversion input terminal 116a. In other words, the electric potential of the inversion input terminal 116b is equal to the reference electric potential $V_{ref}$. Then the voltage in the resistor 103 is $V_{in}-V_{ref}$ and a current $I_1$ expressed as Equation 2 flows through the resistor 103.

$$I_1=(V_{in}-V_{ref})/R \quad \text{(Equation 2)}$$

The current $I_1$ flows through the resistor from the side connected to the analog signal input line 107 toward the side connected to the inversion input terminal 116b.

R represents the resistance of the resistor 103. The current $I_1$ is inputted to the diode 101. The drain current of the correction TFT 114 that constitutes the diode 101 corresponds to the current $I_1$. Since the drain region and the gate electrode are connected to each other in the correction TFT 114, the gate voltage of the TFT 114 is equal to the drain-source voltage thereof. Therefore the correction TFT 114 operates in the saturation range.

Being a p-channel TFT, the correction TFT 114 is not turned conductive unless the electric potential of the correction TFT becomes higher on the side connected to the inversion input terminal 116b of the operation amplifier 104 than the side connected to the output terminal of the operation amplifier 104.

Therefore the correction TFT on the side connected to the inversion input terminal 116b of the operation amplifier 104 serves as a source region whereas the side connected to the output terminal of the operation amplifier 104 serves as a drain region. The correction TFT thus functions as a diode that allows a current to flow in only one direction.

Equation 1 given in the above is applicable to a TFT that operates in the saturation range. The gate voltage is obtained by transforming Equation 1. Based on this transformation, the gate voltage $V_{GS1}$ when the drain current is $I_1$ is obtained by Equation 3.

$$V_{GS1}=-\sqrt{2I_1(1/\mu_0 C_0)(L_1/W_1)}+V_{th1} \quad \text{(Equation 3)}$$

wherein, $W_1$ represents the gate width of the correction TFT 114, $L_1$ represents the gate length of the correction TFT 114, and $V_{th1}$ represents the threshold voltage of the correction TFT 114.

However, the gate voltage $V_{GS1}$ and the threshold voltage $V_{th1}$ are usually 0 or smaller since the correction TFT 114 here is a p-channel TFT.

Initially, the reset TFT 117 is conductive and the electric potential of the source signal line 106 is set to 0 V.

Then the reset TFT 117 is turned unconductive. Since the gate voltage and the drain-source voltage are equal to each other in the correction TFT 114, an electric potential $V_{ref}$ + $V_{GS1}$ (the reference electric potential shifted by the voltage $V_{GS1}$) is inputted to the source signal line.

Before the electric potential $V_{ref}$+$V_{VGS1}$ is inputted to the source signal line 106, the electric potential of the source signal line 106 is set to 0 V by turning the reset TFT 117 conductive. This is carried out in anticipation for the case in which the electric potential of the source signal line 106 in a certain state is raised higher than the electric potential of the inversion input terminal 116b of the operation amplifier 104 determined by a signal electric potential next inputted to the analog signal input line 107. In this case, the source region and the drain region interchanges their places in the correction TFT 114 to make the correction TFT 114 unconductive and block feedback between the input and output of the operation amplifier 104. The invention avoids this situation by setting the electric potential of the source signal line to 0 V initially.

The electric potential given to the output terminal of the operation amplifier 104 when the reset TFT 117 is turned conductive is not limited to 0 V. In general, the output terminal receives an electric potential set equal to or lower than the lowest electric potential outputted to the source signal line (hereinafter referred to as lowest electric potential $V_{SLOW}$) which corresponds to the highest electric potential of the signal inputted to the analog signal input line. In other words, the electric potential of the output terminal of the operation amplifier 104 is set so as to be equal to or lower than the lowest electric potential $V_{SLOW}$ by turning the reset TFT 117 conductive.

The operation of setting the electric potential of the output terminal of the operation amplifier to the lowest electric potential $V_{SLOW}$ so that the correction TFT that is a p-channel TFT is always conductive is called a reset operation in this specification.

The reset operation can be carried out during the retrace period (horizontal retrace period) or other times.

The electric potential $V_{ref}$+$V_{GS1}$ inputted to the source signal line 106 is inputted to the capacitor 119 and to the gate electrode of the EL driving TFT 102 through the switching TFT 111, which has been turned conductive upon input of a signal to the gate signal line 113. The electric potential of the power supply line 105 (power supply electric potential) is set to the same level as the reference electric potential $V_{ref}$. Accordingly, the source region of the EL driving TFT 102 in a conductive state has an electric potential equal to $V_{ref}$.

At this point, a gate voltage $V_{GS2}$ of the EL driving TFT 102 is equal to the gate voltage $V_{GS1}$ of the correction TFT 114.

If the EL driving TFT 102 also operates in the saturation range, Equation 1 is applicable to the TFT 102. The drain current of the TFT 102 in this case is given as $I_2$, which is obtained by Equation 4.

$$I_2 = (1/2)\mu_0 C_0 (W_2/L_2)(V_{GS1} - V_{th2})^2 \quad \text{(Equation 4)}$$

wherein, $V_{th2}$ represents the threshold voltage of the EL driving TFT 102, and $W_2$ and $L_2$ represent the gate width and the gate length of the EL driving TFT 102, respectively.

If the threshold voltage $V_{th1}$ of the correction TFT 114 is almost equal to the threshold voltage $V_{th2}$ of the EL driving TFT 102, the drain current $I_2$ of the EL driving TFT 102 is independent of the threshold voltage of the two TFTs as shown in Equation 5.

$$I_2 = I_1 (W_2/L_2)(L_1/W_1) \quad \text{(Equation 5)}$$

In this way, the current $I_2$ that corresponds to the current $I_1$ linearly can be inputted to the EL element 112.

Figure 2:
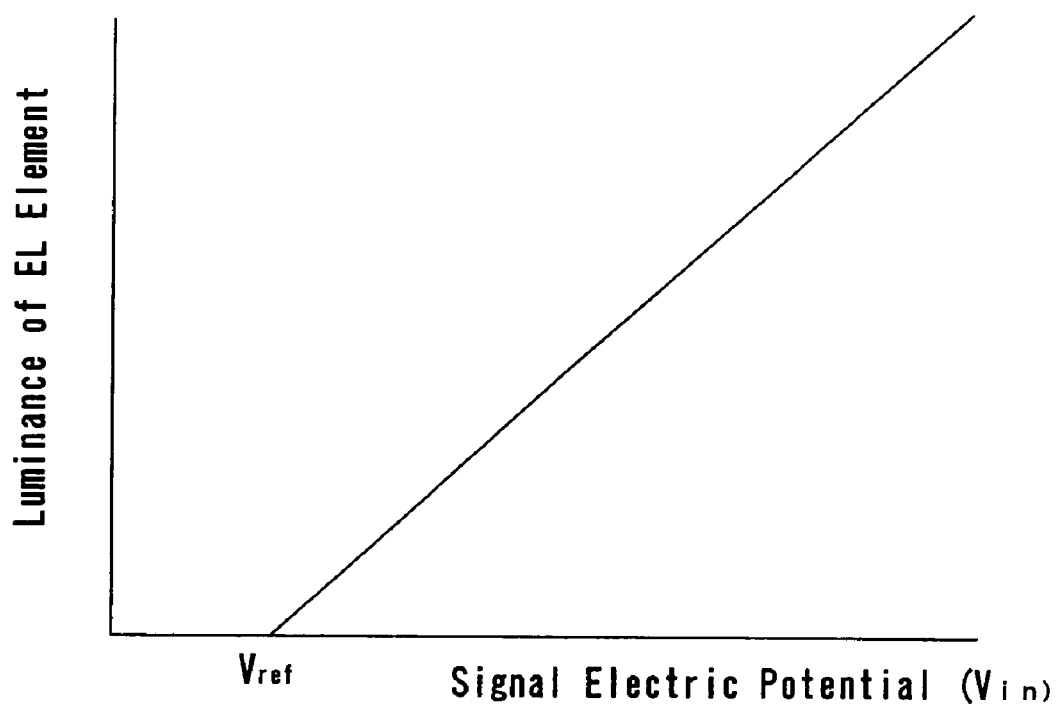
FIG. 2 is a graph showing the relation between an input voltage and the luminance of an EL element in the EL display device of the present invention.

Equation 2 shows that the current $I_1$ is in proportion to the input electric potential $V_{in}$. FIG. 2 is a graph showing the relation between the signal electric potential $V_{in}$ of a video signal and the luminance of the EL element in the EL display device structured as above. The axis of abscissa indicates the signal electric potential $V_{in}$ of the video signal and the axis of ordinate indicates the luminance of the EL element. As the graph shows, the EL element 112 can emit light at a luminance linearly corresponding to the input voltage $V_{in}$.

Figure 3:
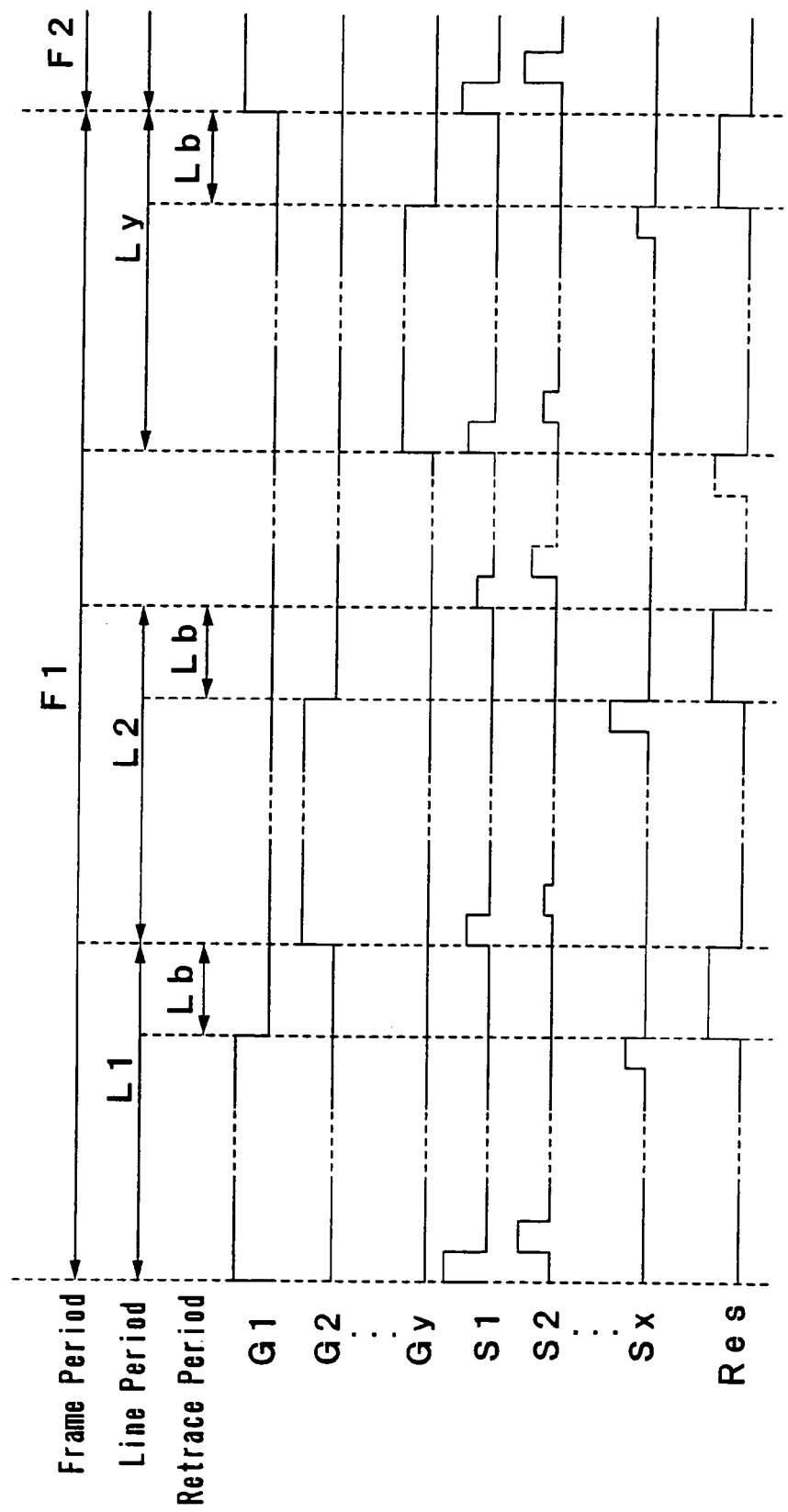
FIG. 3 is a timing chart of the EL display device according to the present invention.
Figure 4:
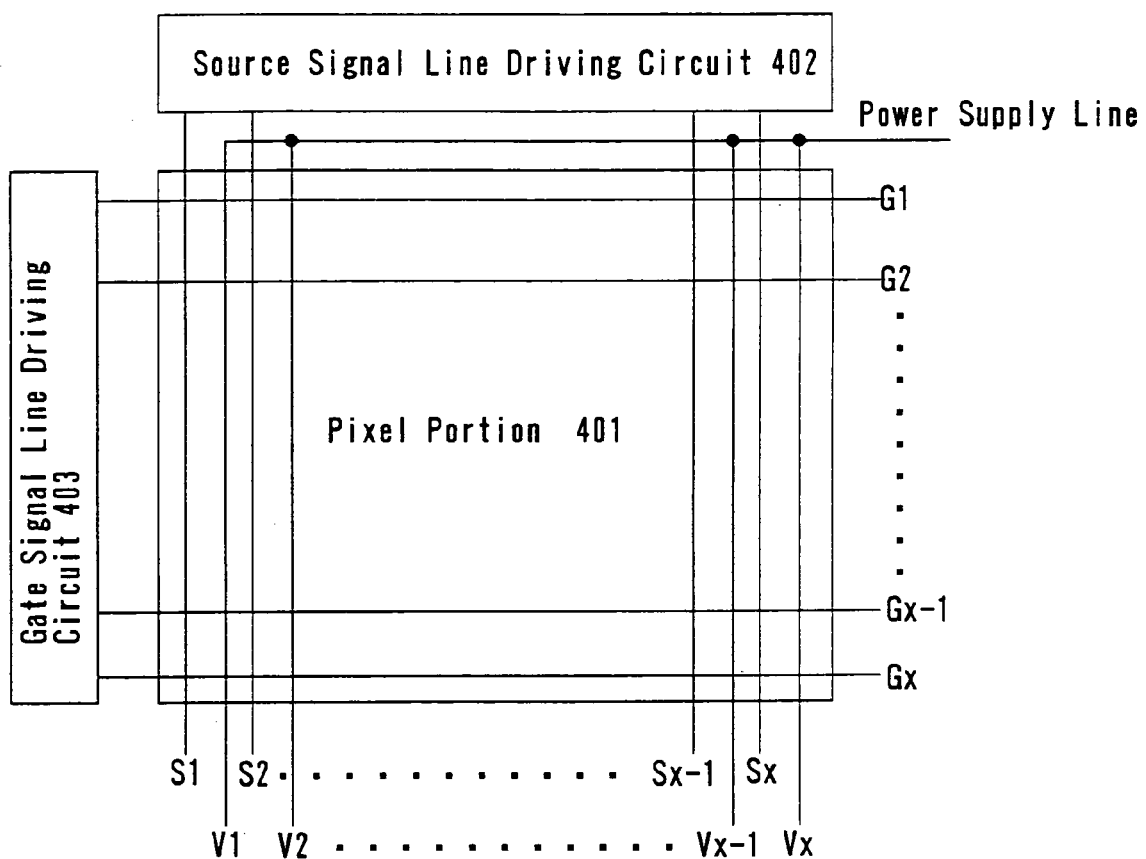
FIG. 4 is a diagram showing the structure of a conventional EL display device.
Figure 5:
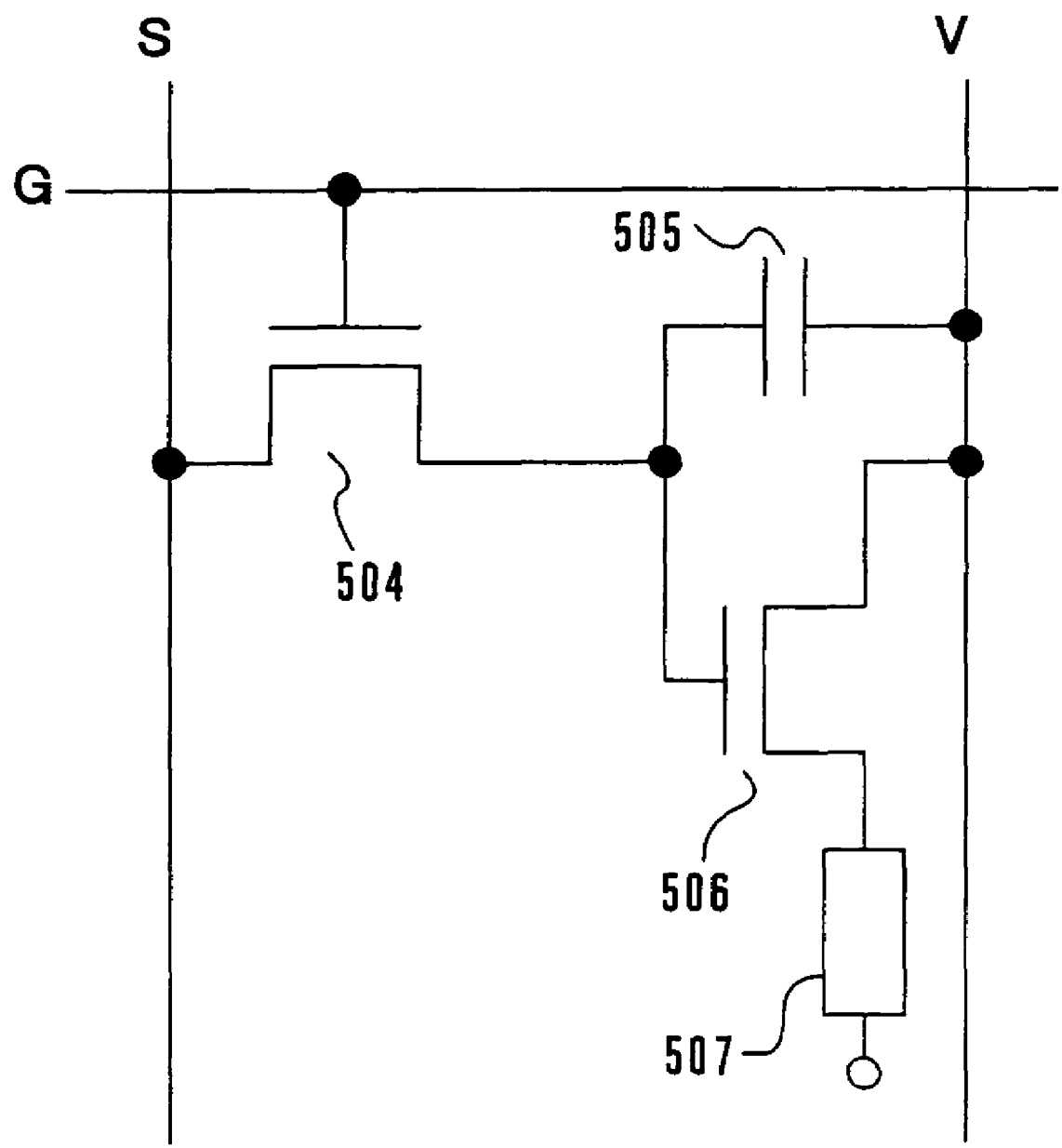
FIG. 5 is a diagram showing the structure of a pixel of the conventional EL display device.

FIG. 3 is a timing chart illustrating the operation of the EL display device structured as shown in FIG. 1. The EL display device has source signal lines S1 to Sx (x lines in total), power supply lines V1 to Vx (x lines in total), and gate signal lines G1 to Gy (y lines in total).

The switching TFT and the reset TFT here are n-channel TFTs. If p-channel TFTs are used for the switching TFT and the reset TFT, the phase of the signals inputted to the gate signal lines G1 to Gy and to the gate electrode of the reset TFT is reversed.

First, signals are inputted to the gate signal line G1 to turn every switching TFT that is connected to the gate signal line G1 conductive. The period during which the gate signal line G1 is selected is called a first line period L1. In the first line period L1, signals inputted from the analog signal input line are sequentially inputted to the source signal lines S1 to Sx. Each EL element emits light at a luminance corresponding to the inputted signal electric potential.

After inputting the signals to all of the source signal lines S1 to Sx is completed, a retrace period Lb is provided in order to input signals to the source signal lines again starting from S1. During the retrace period Lb, a signal Res is inputted to the gate electrode of the reset TFT to turn the reset TFT conductive, so that the electric potential is set to 0 V in all of the source signal lines S1 to Sx.

Thereafter, signals are inputted to the gate signal line G2 to turn every switching TFT that is connected to the gate signal line G2 conductive. Thus started is a second line period L2. Similar to the first line period L1, signals inputted from the analog signal input line are sequentially inputted to the source signal lines S1 to Sx during the second line period L2. Each EL element emits light at a luminance corresponding to the inputted signal electric potential.

After inputting the signals to all of the source signal lines S1 to Sx is completed, a retrace period Lb is provided in order to input signals to the source signal lines again starting from S1. During the retrace period Lb, a signal Res is inputted to the gate electrode of the reset TFT to turn the reset TFT conductive, so that the electric potential is set to 0 V in all of the source signal lines S1 to Sx.

The same operation is repeated for all of the gate signal lines G1 to Gy to display one image. A period the display device takes to display one image is called one frame period. The operations above completes one frame period F1.

After completion of the frame period F1, the gate signal line G1 is again selected to start a second frame period F2.

The EL display device shown in FIG. 1 in accordance with the present invention displays images by repeating the above operations.

Figure 19:
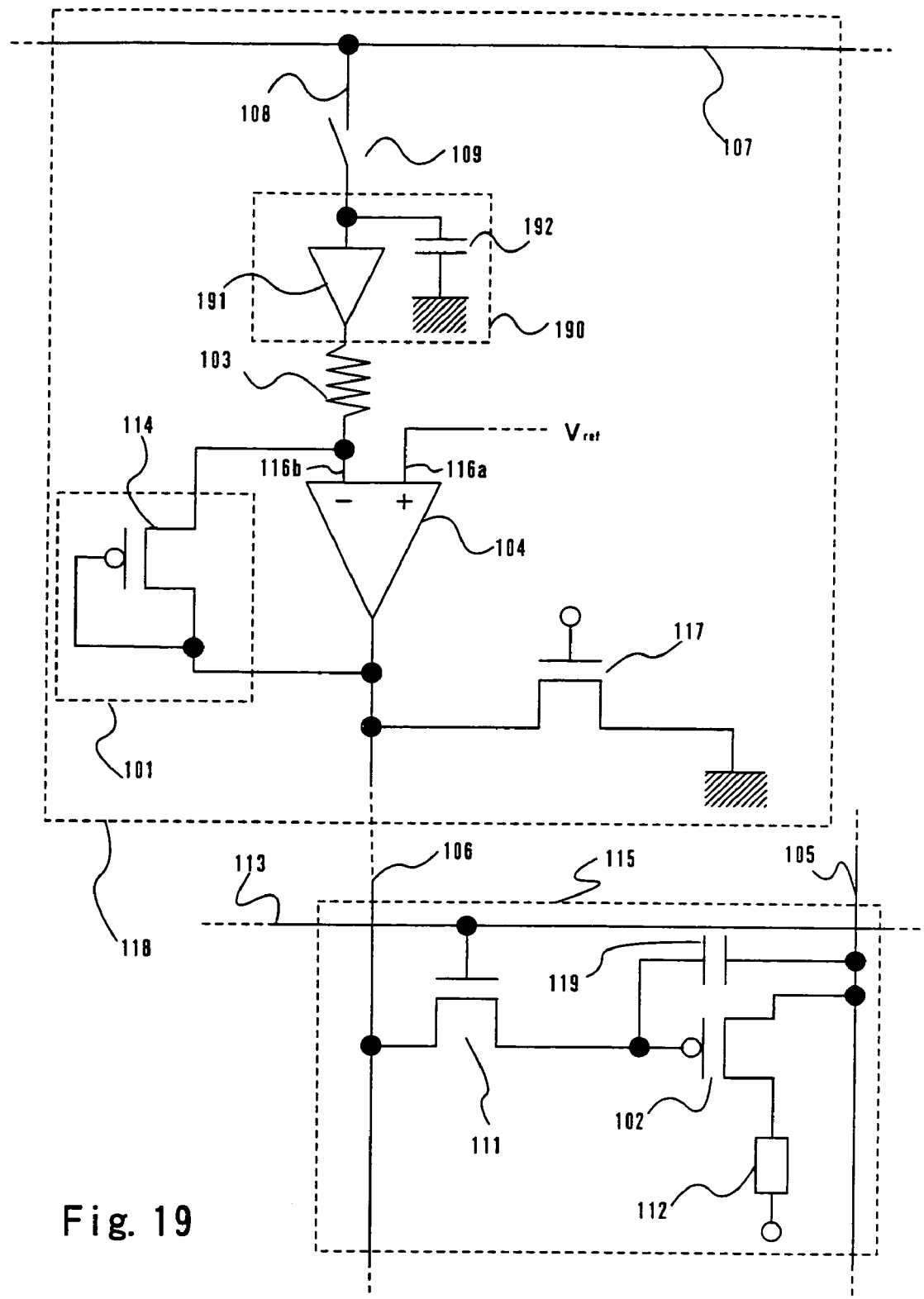
FIG. 19 is a circuit diagram showing the structure of an EL display device according to the present invention.

A buffer circuit 190 may be placed between the switch 109 and the resistor 103 as shown in FIG. 19. The buffer circuit 190 is composed of a buffer 191 and a capacitor 192.

Embodiments of the present invention will be described below.

Embodiment 1

Figure 9:
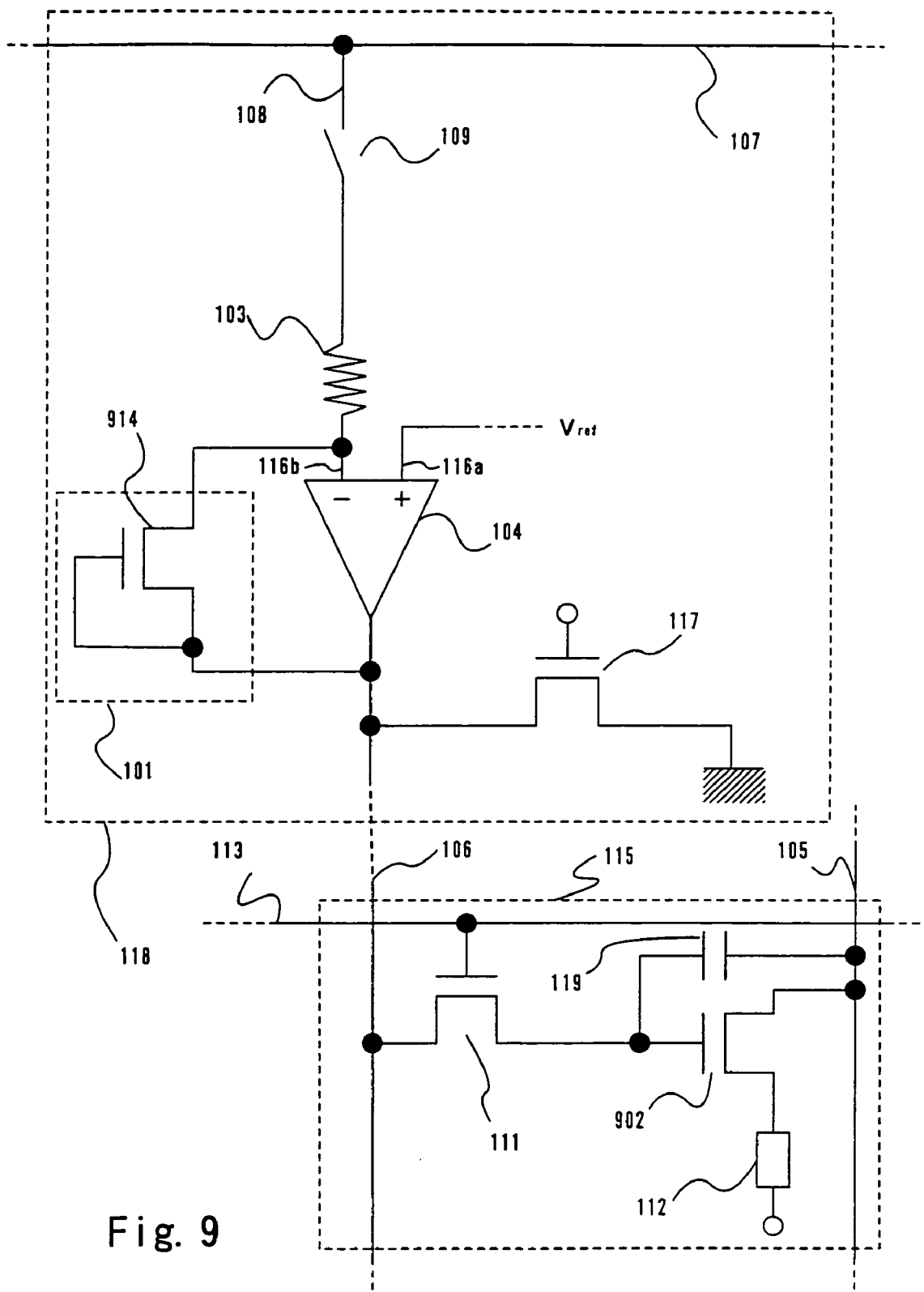
FIG. 9 is a circuit diagram showing the structure of still another EL display device according to the present invention.

This embodiment describes with reference to FIG. 9 a case of using n-channel TFTs for the correction TFT and the EL driving TFT in FIG. 1. Components in FIG. 9 that are identical with those in FIG. 1 are denoted by the same symbols.

FIG. 9 shows a pixel 115 of an EL display device according to the present invention, as well as a portion 118 of a source signal line driving circuit for inputting a signal to the pixel.

The portion 118 of the source signal line driving circuit is composed of a diode 101, a resistor 103, an operation amplifier 104, an analog signal input line 107, a signal line 108, a switch 109, and a reset TFT 117. The diode 101 consists of a correction TFT 914 in which a gate electrode and a drain region are electrically connected to each other.

The correction TFT 914 is an n-channel TFT. The reset TFT 117 may either be a p-channel TFT or an n-channel TFT.

The pixel 115 is composed of an EL driving TFT 902, a power supply line 105, a source signal line 106, a switching TFT 111, an EL element 112, a gate signal line 113, and a capacitor 119. The EL driving TFT 902 is an n-channel TFT. The switching TFT 111 may either be a p-channel TFT or an n-channel TFT.

The analog signal input line 107 is connected to the signal line 108, which is connected through the switch 109 to the resistor 103. The resistor 103 is connected to an inversion input terminal 116b of the operation amplifier 104. The inversion input terminal 116b of the operation amplifier 104 is connected to a source region of the correction TFT 914. The operation amplifier 104 has a non-inversion input terminal 116a, to which a reference electric potential $V_{ref}$ is inputted. An output terminal of the operation amplifier 104 is connected to a drain region of the correction TFT 914 and to the source signal line 106. The reset TFT 117 has a source region and a drain region one of which is connected to the source signal line 106 and the other of which is grounded.

The switching TFT 111 has a gate electrode connected to the gate signal line 113. The switching TFT 111 also has a source region and a drain region one of which is connected to the source signal line 106 and the other of which is connected to a gate electrode of the EL driving TFT 902 and to one of two electrodes of the capacitor 119. The EL driving TFT 902 has a source region connected to the power supply line 105 and has a drain region connected to a cathode of the EL element 112. The other electrode of the capacitor 119 is connected to the power supply line 105. An anode of the EL element 112 is connected to a reference power line, which is not shown in FIG. 9.

A method of driving the display device shown in FIG. 9 will be described.

A signal voltage $V_{in}$ of a video signal inputted to the analog signal input line 107 is sampled when the switch 109 is opened or closed. The signal voltage is then inputted to the signal line 108.

In this embodiment, the signal electric potential $V_{in}$ is equal to or smaller than the reference electric potential $V_{ref}$. A signal having a smaller $V_{in}$ value represents a higher luminance.

The inversion input terminal 116b and the output terminal of the operation amplifier 104 are connected to each other through the diode 101. Therefore the electric potential of the inversion input terminal 116b is the same as the electric potential of the non-inversion input terminal 116a. In other words, the electric potential of the non-inversion input terminal 116b is equal to the reference electric potential $V_{ref}$. Then, the voltage in the resistor 103 is $V_{ref}-V_{in}$ and a current $I_1$ expressed as Equation 6 flows through the resistor 103.

$$I_1 = (V_{ref}-V_{in})/R \qquad \text{(Equation 6)}$$

In this embodiment, the current $I_1$ flows through the resistor from the side connected to the inversion input terminal 116b of the operation amplifier 104 toward the side connected to the analog signal input line 107.

Herein, R represents the resistance of the resistor 103. The current $I_1$ flows through the diode 101. The drain current of the correction TFT 914 that constitutes the diode 101 corresponds to the current $I_1$. Since the drain region and the gate electrode are connected to each other in the correction TFT 914, the gate voltage of the TFT 914 is equal to the drain-source voltage thereof. Therefore the correction TFT 914 operates in the saturation range.

Being an n-channel TFT, the correction TFT 914 is not turned conductive unless the electric potential of the correction TFT becomes lower on the side connected to the inversion input terminal 116b of the operation amplifier 104 than the side connected to the output terminal of the operation amplifier 104.

Therefore the correction TFT 914 on the side connected to the inversion input terminal 116b of the operation amplifier 104 serves as a source region whereas the side connected to the output terminal of the operation amplifier 104 serves as a drain region. The correction TFT thus functions as a diode that allows a current to flow in only one direction.

Equation 1 given in the above is applicable to a TFT that operates in the saturation range. The gate voltage is obtained by transforming Equation 1. Based on this transformation, the gate voltage $V_{GS1}$ when the drain current is $I_1$ is obtained by Equation 7.

$$V_{GS1} = \sqrt{2I_1(1/\mu_0 C_0)(L_1/W_1)} + V_{th1} \qquad \text{(Equation 7)}$$

where, $W_1$ represents the gate width of the correction TFT 914, $L_1$ represents the gate length of the correction TFT 914, and $V_{th1}$ represents the threshold voltage of the correction TFT 914.

Initially, the reset TFT 117 is conductive and the electric potential of the source signal line 106 is set to 0 V.

Then the reset TFT 117 is turned unconductive. Since the gate voltage and the drain-source voltage are equal to each other in the correction TFT 914, an electric potential $V_{ref}+V_{GS1}$ (the reference electric potential $V_{ref}$ shifted by the voltage $V_{GS1}$) is inputted to the source signal line 106.

Before the electric potential $V_{ref}+V_{GS1}$ is inputted to the source signal line 106, the electric potential of the source signal line 106 is set to 0 V by the reset TFT 117. This is carried out in anticipation for the case in which the electric potential of the source signal line 106 in a certain state is reduced lower than the electric potential of the inversion input terminal 116b of the operation amplifier 104 changed by a signal electric potential inputted next. In this case, the source region and the drain region interchange their places in the correction TFT 914 to make the correction TFT 914 unconductive and block feedback between the input and output of the operation amplifier 104. The present invention avoids this situation by setting the electric potential of the source signal line to 0 V during the retrace period (horizontal retrace period).

The electric potential given to the output terminal of the operation amplifier 104 when the reset TFT 117 is turned conductive is not limited to 0 V. In general the output terminal receives an electric potential set equal to or higher than the highest electric potential outputted to the source signal line (hereinafter referred to as highest electric potential $V_{SHi}$) which corresponds to the lowest electric potential of the signal inputted to the analog signal input line. In other words, the electric potential of the output terminal of the operation amplifier 104 is set so as to be equal to or higher than the highest electric potential $V_{SHi}$ by turning the reset TFT 117 conductive.

The operation of setting the electric potential of the output terminal of the operation amplifier to the highest electric potential so that the correction TFT that is an n-channel TFT is always conductive is called a reset operation.

The electric potential $V_{ref}+V_{GS1}$ inputted to the source signal line 106 is inputted to the capacitor 119 and to the gate electrode of the EL driving TFT 902 through the switching TFT 111, which has been turned conductive upon input of a signal to the gate signal line 113. The electric potential of the power supply line 105 (power supply electric potential) is set to the same level as the reference electric potential $V_{ref}$. Accordingly, the source region of the EL driving TFT 902 in a conductive state has an electric potential equal to $V_{ref}$.

At this point, a gate voltage $V_{GS2}$ of the EL driving TFT 902 is equal to the gate voltage $V_{GS1}$ of the correction TFT 914. If the EL driving TFT 902 also operates in the saturation range, Equation 1 is applicable to the TFT 902. The drain current of the TFT 902 in this case is given as $I_2$, which is obtained by Equation 8.

$$I_2=(1/2)\mu_0 C_0(W_2/L_2)(V_{GS1}-V_{th2})^2 \quad \text{(Equation 8)}$$

where, $V_{th2}$ represents the threshold voltage of the EL driving TFT 902, and $W_2$ and $L_2$ represent the gate width and the gate length of the EL driving TFT 902, respectively.

If the threshold voltage $V_{th1}$ of the correction TFT 914 is almost equal to the threshold voltage $V_{th2}$ of the EL driving TFT 902, the drain current $I_2$ of the EL driving TFT 902 is independent of each threshold voltage of the two TFTs as shown in Equation 9.

$$I_2=I_1(W_2/L_2)(L_1/W_1) \quad \text{(Equation 9)}$$

In this way, the current $I_2$ that corresponds to the current $I_1$ linearly can be inputted to the EL element 112.

Equation 6 shows that the current $I_1$ is in proportion to the input electric potential $V_{in}$. Thus the EL element 112 can emit light at a luminance linearly corresponding to the input potential $V_{in}$.

Figure 10:
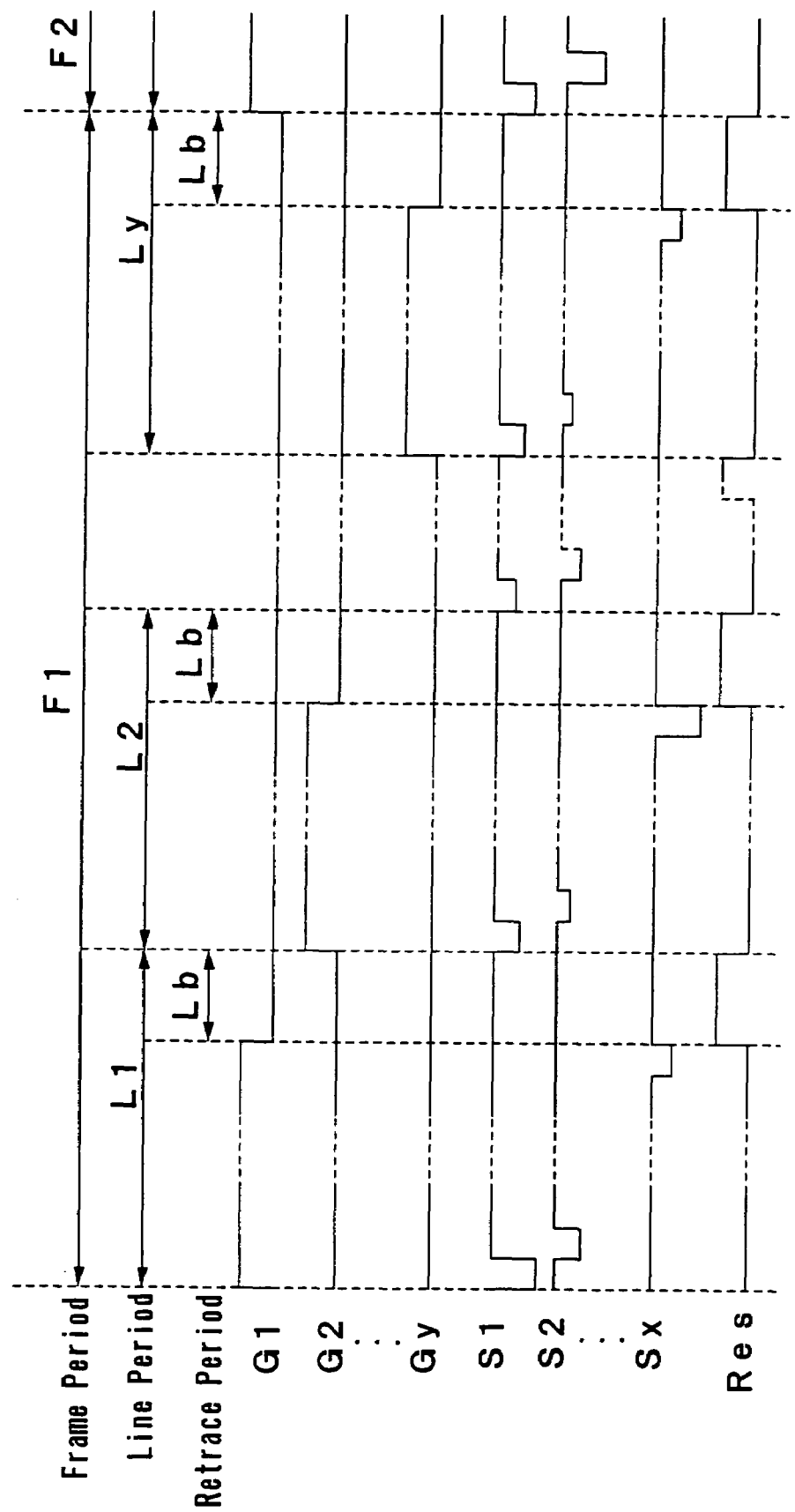
FIG. 10 is a timing chart of the EL display device according to the present invention.

FIG. 10 is a timing chart illustrating the operation of the EL display device structured as shown in FIG. 9. The EL display device has source signal lines S1 to Sx (x lines in total), power supply lines V1 to Vx (x lines in total), and gate signal lines G1 to Gy (y lines in total).

The switching TFT 111 and the reset TFT 117 here are n-channel TFTs. If p-channel TFTs are used for the switching TFT and the reset TFT, the phase of the signals inputted to the gate signal lines G1 to Gy and to the gate electrode of the reset TFT 117 is reversed.

First, signals are inputted to the gate signal line G1 to turn every switching TFT 111 that is connected to the gate signal line G1 conductive. The period during which the gate signal line G1 is selected is called a first line period L1. In the first line period L1, signals inputted from the analog signal input line 107 are sequentially inputted to the source signal lines S1 to Sx. Each EL element 112 emits light at a luminance corresponding to the inputted signal electric potential.

After inputting the signals to all of the source signal lines S1 to Sx is completed, a retrace period Lb is provided in order to input signals to the source signal lines again starting from S1. During the retrace period Lb, a signal Res is inputted to the gate electrode of the reset TFT 117 to turn the reset TFT 117 conductive, so that the electric potential is set to 0 V in all of the source signal lines S1 to Sx.

Thereafter, signals are inputted to the gate signal line G2 to turn every switching TFT 111 that is connected to the gate signal line G2 conductive. Thus started is a second line period L2. Similar to the first line period L1, signals inputted from the analog signal input line 107 are sequentially inputted to the source signal lines S1 to Sx during the second line period L2. Each EL element 112 emits light at a luminance corresponding to the inputted signal electric potential.

After inputting the signals to all of the source signal lines S1 to Sx is completed, a retrace period Lb is provided in order to input signals to the source signal lines again starting from S1. During the retrace period Lb, a signal Res is inputted to the gate electrode of the reset TFT to turn the reset TFT conductive, so that the electric potential is set to 0 V in all of the source signal lines S1 to Sx.

The same operation is repeated for all of the gate signal lines G1 to Gy to display one image. A period the display device takes to display one image is called one frame period. The operation above completes one frame period F1.

After completion of the frame period F1, the gate signal line G1 is again selected to start a second frame period F2.

The EL display device shown in FIG. 9 in accordance with the present invention displays images by repeating the above operations.

Embodiment 2

This embodiment describes a driving circuit having a structure different from the one in FIG. 1.

Figure 6:
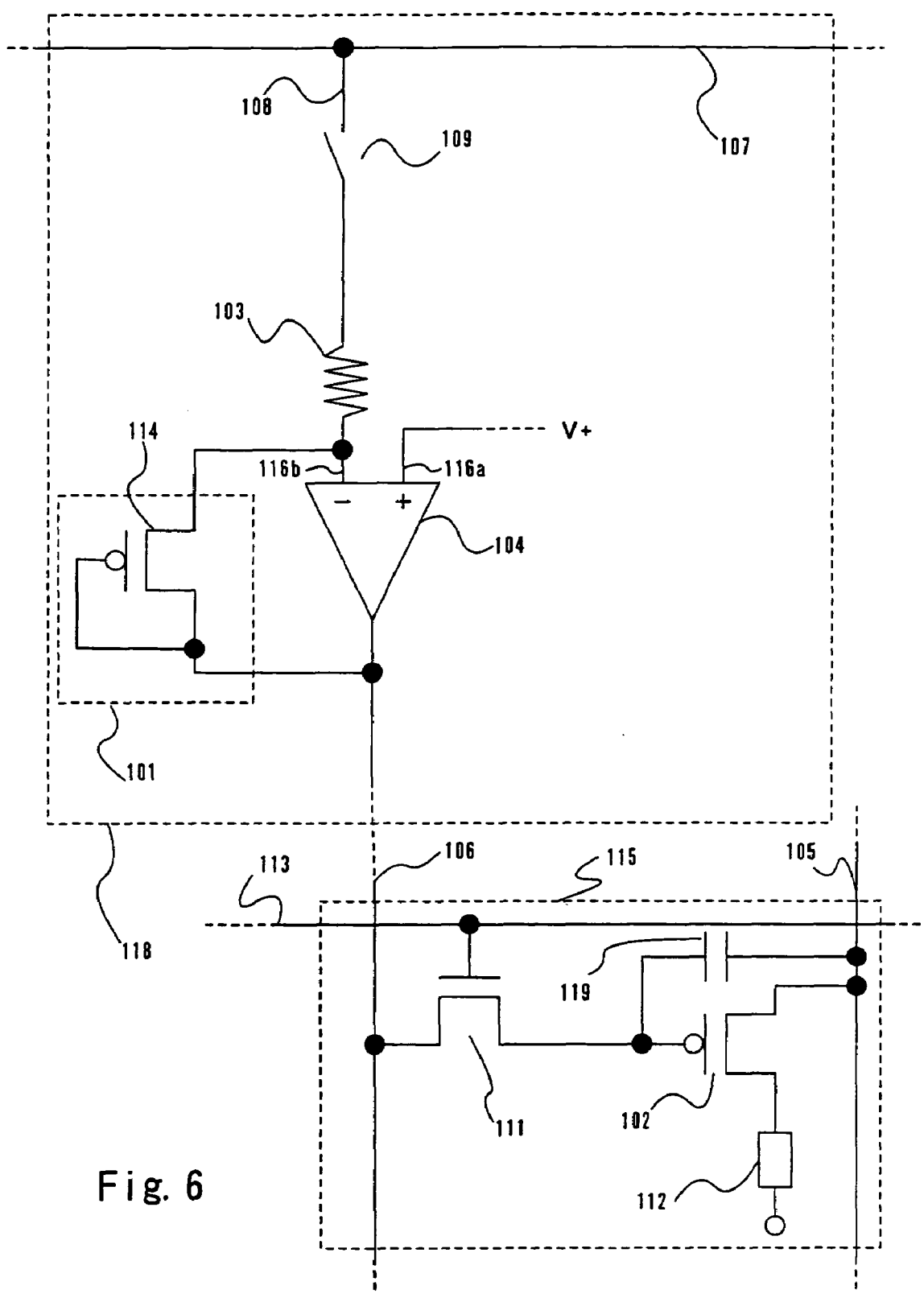
FIG. 6 is a circuit diagram showing the structure of another EL display device according to the present invention.

FIG. 6 shows the structure of the driving circuit according to this embodiment. Components in FIG. 6 that are identical with those in FIG. 1 are denoted by the same symbols and explanations thereof are omitted. Unlike FIG. 1, the reset TFT 117 is not provided in FIG. 6.

For that reason, measures other than the reset TFT are taken to reduce the electric potential of the source signal line 106 prior to input of a signal to a level lower than the electric potential of the inversion input terminal 116b of the operation amplifier 104 determined by a video signal inputted next. The period assigned to reduce the electric potential of the source signal line 106 prior to input of a signal to a level lower than the electric potential of the inversion input terminal 116b of the operation amplifier 104 determined by a video signal inputted next, is called a reset period.

In FIG. 6, an electric potential $V_+$ inputted to the non-inversion input terminal 106a of the operation amplifier 104 is kept at the reference electric potential $V_{ref}$ while a video signal is sampled. On the other hand, $V_+$ is reduced to an electric potential $V_{LOW}$ during the reset period. The electric potential $V_{LOW}$ is always set to a level lower than the electric potential of the inversion input terminal 116b of the operation amplifier 104 whatever electric potential the inversion input terminal takes due to a video signal inputted from the external.

Therefore the electric potential $V_{LOW}$ is set to a level equal to or lower than the reference electric potential $V_{ref}$.

In the reset period, the electric potential of the non-inversion input terminal 106a of the operation amplifier 104 is equal to the electric potential $V_{LOW}$.

Then the electric potential of the non-inversion input terminal 116a is lower than the electric potential of the inversion input terminal 1016b to cause the operation amplifier 104 to output a low power supply electric potential. In this way, the output terminal of the operation amplifier is kept to a sufficiently low electric potential.

The electric potential of the source signal line 106 is thus reduced to a level equal to or lower than $V_{LOW}$.

After the reset period, the electric potential of the non-inversion input terminal 116a of the operation amplifier 104 is returned to $V_{ref}$ and then a video signal is inputted. Since the electric potential of the inversion input terminal 116b of the operation amplifier 104 is always higher than the electric potential $V_{LOW}$, the diode 101 keeps operating in a conductive state (without being accidentally turned unconductive) to effect feedback between the input and output of the operation amplifier 104. The operation amplifier thus operates so as to equalize the electric potential of the non-inversion input terminal 116a with the electric potential of the inversion input terminal 116b.

The reset period is provided within the retrace period (horizontal retrace period).

The other operations are the same as those in Embodiment Mode.

Figure 7:
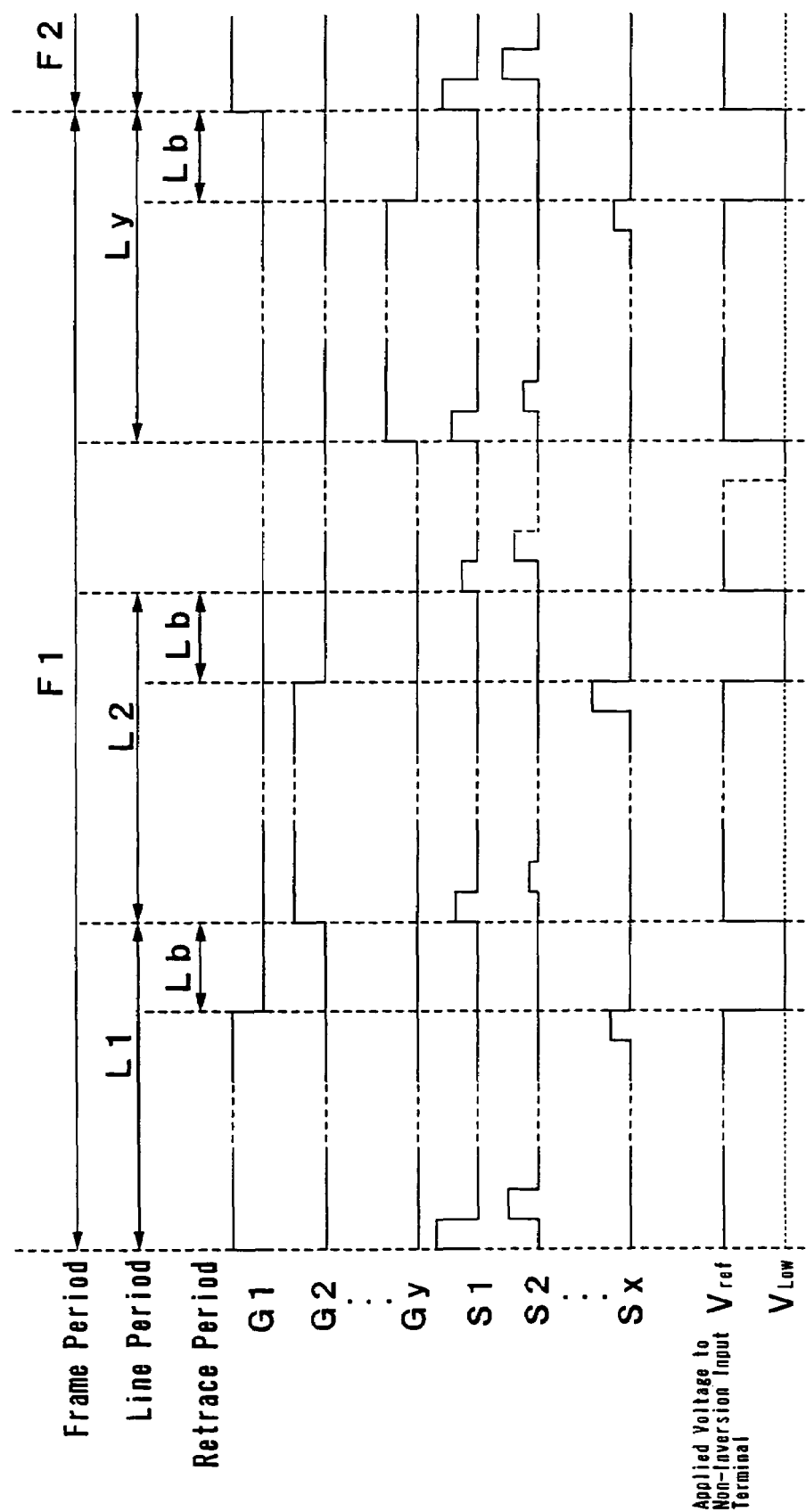
FIG. 7 is a timing chart of the EL display device according to the present invention.
Figure 8:
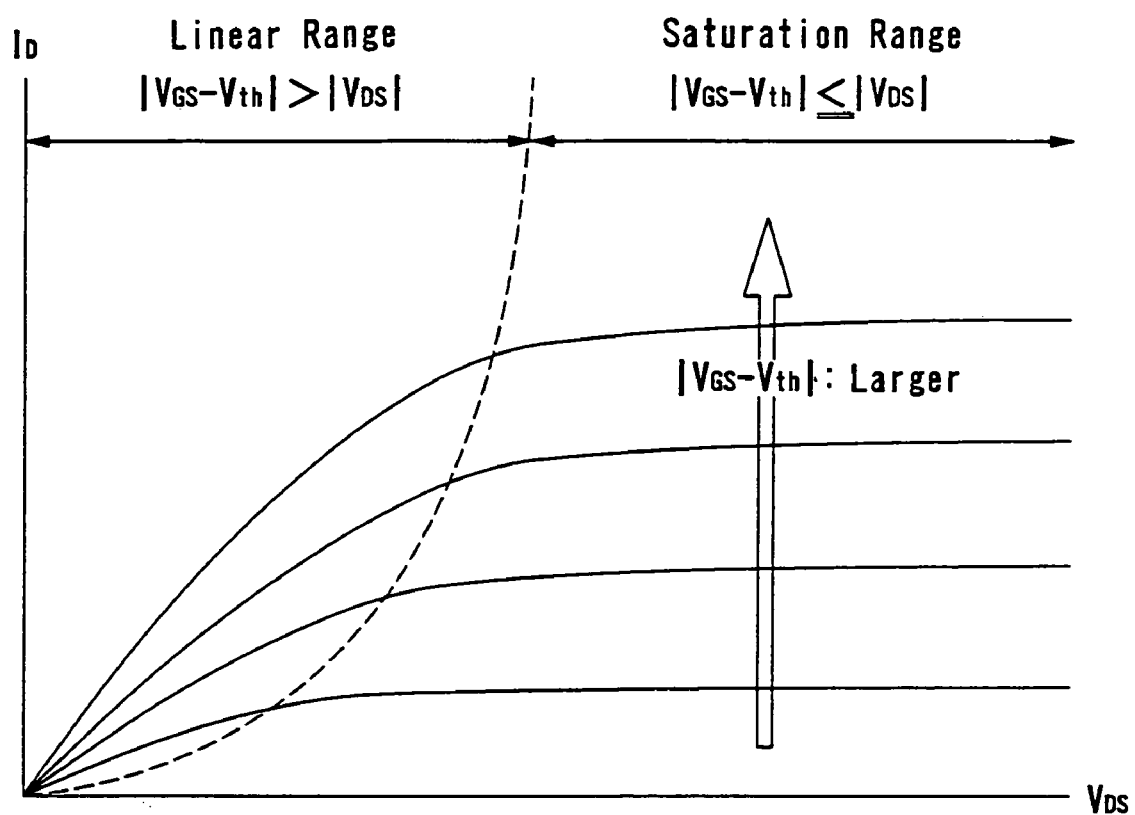
FIG. 8 is a diagram showing the operation range of an EL driving TFT of analog gray scale system.

FIG. 7 is a timing chart illustrating the operation of the EL display device structured as shown in FIG. 6. The EL display device has source signal lines S1 to Sx (x lines in total), power supply lines V1 to Vx (x lines in total), and gate signal lines G1 to Gy (y lines in total).

The switching TFT 111 here is an n-channel TFT. If a p-channel TFT is used for the switching TFT, the phase of the signal inputted to the gate signal lines G1 to Gy is reversed.

First, signals are inputted to the gate signal line G1 to turn every switching TFT 111 that is connected to the gate signal line G1 conductive. The period during which the gate signal line G1 is selected is called a first line period L1. In the first line period L1, signals inputted from the analog signal input line 107 are sequentially inputted to the source signal lines S1 to Sx. Each EL element 112 emits light at a luminance corresponding to the inputted signal electric potential.

After inputting the signals to all of the source signal lines S1 to Sx is completed, a retrace period (horizontal retrace period) Lb is provided in order to input signals to the source signal lines again starting from S1. During the retrace period Lb, the electric potential $V_{LOW}$ is inputted to the non-inversion input terminal 116a of the operation amplifier 104 to set the electric potential to a level equal to or lower than $V_{LOW}$ in all of the source signal lines S1 to Sx.

Thereafter, signals are inputted to the gate signal line G2 to turn every switching TFT 111 that is connected to the gate signal line G2 conductive. Thus started is a second line period L2. Similar to the first line period L1, signals inputted from the analog signal input line 107 are sequentially inputted to the source signal lines S1 to Sx during the second line period L2. Each EL element 112 emits light at a luminance corresponding to the inputted signal electric potential.

After inputting the signals to all of the source signal lines S1 to Sx is completed, a retrace period Lb is provided in order to input signals to the source signal lines again starting from S1. During the retrace period Lb, the electric potential $V_{LOW}$ is inputted to the non-inversion input terminal 116a of the operation amplifier 104 to set the electric potential to a level equal to or lower than $V_{LOW}$ in all of the source signal lines S1 to Sx.

The same operation is repeated for all of the gate signal lines G1 to Gy to display one image. A period the display device takes to display one image is called one frame period. The operations above complete a first frame period F1.

After completion of the first frame period F1, the gate signal line G1 is again selected to start a second frame period F2.

The EL display device shown in FIG. 6 in accordance with the present invention displays images by repeating the above operations.

Embodiment 3

This embodiment describes a driving circuit having a structure different from the one in FIG. 9.

Figure 11:
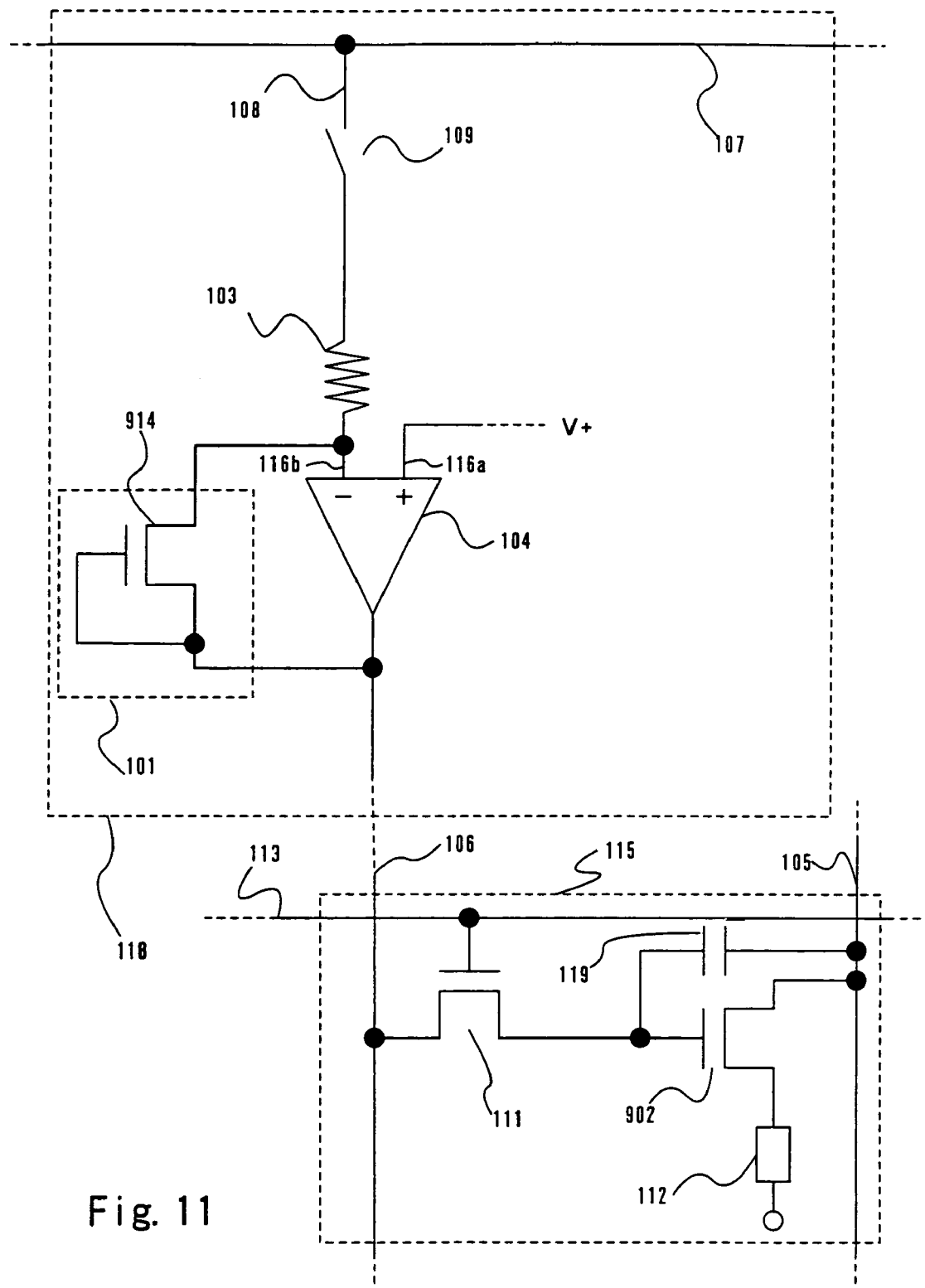
FIG. 11 is a diagram showing the structure of yet still another EL display device according to the present invention.

FIG. 11 shows the structure of the driving circuit according to this embodiment. Components in FIG. 11 that are identical with those in FIG. 9 are denoted by the same symbols and explanations thereof are omitted. Unlike in FIG. 9, no reset TFT 117 is provided in FIG. 11.

For that reason, measures other than the reset TFT are taken to raise the electric potential of the source signal line 106 prior to input of a signal to a level higher than the electric potential of the inversion input terminal 116b of the operation amplifier 104 determined by a video signal inputted next. The period assigned to raise the electric potential of the source signal line 106 prior to input of a signal to a level higher than the electric potential of the inversion input terminal 116b of the operation amplifier 104 determined by a video signal inputted next, is called a reset period.

In FIG. 11, an electric potential $V_+$ inputted to the non-inversion input terminal 106a of the operation amplifier 104 is kept at the reference electric potential $V_{ref}$ while a video signal is sampled. On the other hand, $V_+$ is raised to an electric potential $V_{Hi}$ during the reset period. The electric potential $V_{Hi}$ is always set to a level higher than the electric potential of the inversion input terminal 116b of the operation amplifier 104 whatever electric potential the inversion input terminal takes due to a video signal inputted from the external.

In other words, the electric potential $V_{Hi}$ is set to a level equal to or higher than the reference electric potential $V_{ref}$.

Then the electric potential of the non-inversion input terminal 106a is higher than the electric potential of the inversion input terminal 106b to cause the operation amplifier 104 to output a high power supply electric potential. In this way, the output terminal of the operation amplifier is kept to a sufficiently high electric potential.

In the reset period, the electric potential of the output terminal of the operation amplifier 104 is equal to or higher than $V_{Hi}$. After the reset period, the electric potential of the non-inversion terminal 116a of the operation amplifier 104 is returned to $V_{ref}$ and then a video signal is inputted. Since the electric potential of the inversion input terminal 116b of the operation amplifier 104 is always lower than the electric potential $V_{Hi}$, the diode 101 keeps operating in a conductive state (without being accidentally turned unconductive) to effect feedback between the input and output of the operation amplifier 104. The operation amplifier thus operates so as to equalize the electric potential of the non-inversion input terminal 116a with the electric potential of the inversion input terminal 116b.

The reset period is provided within the retrace period (horizontal retrace period).

The other operations are the same as those in Embodiment 1.

Figure 12:
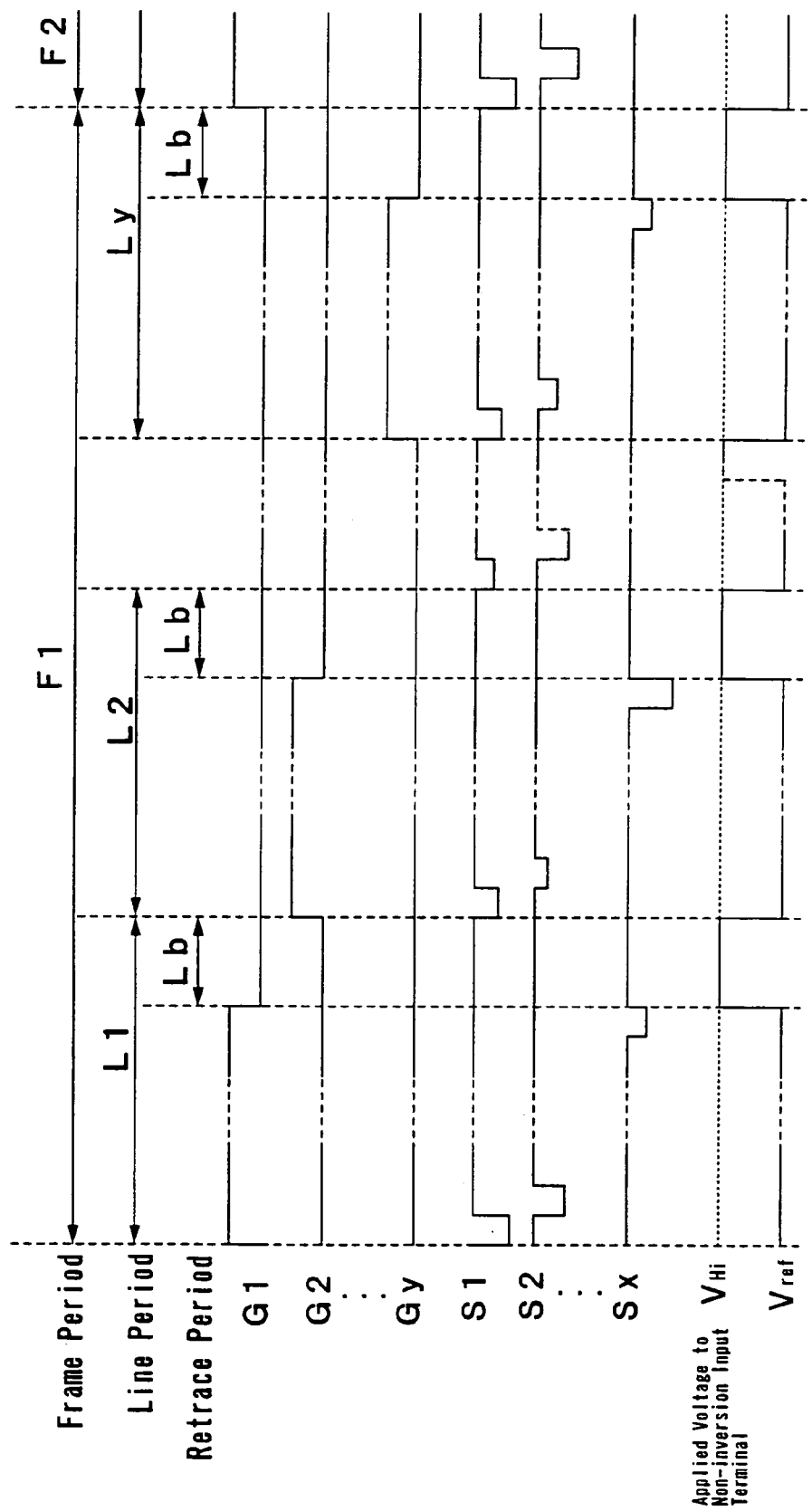
FIG. 12 is a timing chart of the EL display device according to the present invention.

FIG. 12 is a timing chart illustrating the operation of the EL display device structured as shown in FIG. 11. The EL display device has source signal lines S1 to Sx (x lines in total), power supply lines V1 to Vx (x lines in total), and gate signal lines G1 to Gy (y lines in total).

The switching TFT 111 here is an n-channel TFT. If a p-channel TFT is used for the switching TFT, the phase of the signal inputted to the gate signal lines G1 to Gy is reversed.

First, signals are inputted to the gate signal line G1 to turn every switching TFT 111 that is connected to the gate signal line G1 conductive. The period during which the gate signal line G1 is selected is called a first line period L1. In the first line period L1, signals inputted from the analog signal input line 107 are sequentially inputted to the source signal lines S1 to Sx. Each EL element 112 emits light at a luminance corresponding to the inputted signal electric potential.

After inputting the signals to all of the source signal lines S1 to Sx is completed, a retrace period (horizontal retrace period) Lb is provided in order to input signals to the source signal lines again starting from S1. During the retrace period Lb, the electric potential $V_{Hi}$ is inputted to the non-inversion input terminal 116a of the operation amplifier 104 to set the electric potential to a level equal to or higher than $V_{Hi}$ in all of the source signal lines S1 to Sx.

Thereafter, signals are inputted to the gate signal line G2 to turn every switching TFT 111 that is connected to the gate signal line G2 conductive. Thus started is a second line period L2. Similar to the first line period L1, signals inputted from the analog signal input line 107 are sequentially inputted to the source signal lines S1 to Sx during the second line period L2. Each EL element 112 emits light at a luminance corresponding to the inputted signal electric potential.

After inputting the signals to all of the source signal lines S1 to Sx is completed, a retrace period Lb is provided in order to input signals to the source signal lines again starting from S1. During the retrace period Lb, the electric potential $V_{Hi}$ is inputted to the non-inversion input terminal 116a of the operation amplifier 104 to set the electric potential to a level equal to or higher than $V_{Hi}$ in all of the source signal lines S1 to Sx.

The same operation is repeated for all of the gate signal lines G1 to Gy to display one image. A period the display device takes to display one image is called one frame period. The operations above complete a first frame period F1.

After completion of the first frame period F1, the gate signal line G1 is again selected to start a second frame period F2.

The EL display device shown in FIG. 11 in accordance with the present invention displays images by repeating the above operations.

Embodiment 4

In this embodiment, a method of simultaneously manufacturing TFTs (n-channel TFT and p-channel TFT) in a pixel portion and a driver circuit provided in the periphery of the pixel portion on the same substrate in the EL display of the present invention is described in detail with reference to FIGS. 14 to 17.

First, in this embodiment, a substrate 300 is used, which is made of glass such as barium borosilicate glass or alumino borosilicate glass, typified by #7059 glass or #1737 glass of Corning Inc. There is no limitation on the substrate 300 as long as a substrate having a light transmitting property is used, and a quartz substrate may also be used. In addition, a plastic substrate having heat resistance to a treatment temperature of this embodiment may also be used.

Then, a base film 301 formed of an insulating film such as a silicon oxide film, a silicon nitride film or a silicon oxynitride film is formed on the substrate 300. In this embodiment, a two-layer structure is used for the base film 301. However, a single layer film or a lamination structure consisting of two or more layers of the insulating film may also be used. As a first layer of the base film 301, a silicon oxynitride film 301a is formed with a thickness of 10 to 200 nm (preferably 50 to 100 nm) using $SiH_4$, $NH_3$, and $N_2O$ as reaction gases by a plasma CVD method. In this embodiment, the silicon oxynitride film 301a (composition ratio Si=32%, O=27%, N=24% and H=17%) having a film thickness of 50 nm is formed. Then, as a second layer of the base film 301, a silicon oxynitride film 301b is formed so as to be laminated on the first layer with a thickness of 50 to 200 nm (preferably 100 to 150 nm) using $SiH_4$ and $N_2O$ as reaction gases by the plasma CVD method. In this embodiment, the silicon oxynitride film 301b (composition ratio Si=32%, O=59%, N=7% and H=2%) having a film thickness of 100 nm is formed.

Subsequently, semiconductor layers 302 to 305 are formed on the base film. The semiconductor layers 302 to 305 are formed such that a semiconductor film having an amorphous structure is formed by a known method (a sputtering method, an LPCVD method, a plasma CVD method or the like), and is subjected to a known crystallization process (a laser crystallization method, a thermal crystallization method, a thermal crystallization method using a catalyst such as nickel, or the like) to obtain a crystalline semiconductor film, and the crystalline semiconductor film is patterned into desired shapes. The semiconductor layers 302 to 305 are formed with a thickness of 25 to 80 nm (preferably 30 to 60 nm). The material of the crystalline semiconductor film is not particularly limited, but it is preferable to form the film using silicon, a silicon germanium ($Si_xGe_{1-x}$ (X=0.0001 to 0.02)) alloy, or the like. In this embodiment, an amorphous silicon film of 55 nm thickness is formed by a plasma CVD method, and then, a nickel-containing solution is held on the amorphous silicon film. A dehydrogenation process of the amorphous silicon film is performed (at 500° C. for 1 hour), and thereafter a thermal crystallization process is performed (at 550° C. for 4 hours) thereto. Further, to improve the crystallinity, a laser annealing process is performed to form the crystalline silicon film. Then, this crystalline silicon film is subjected to a patterning process using a photolithography method to obtain the semiconductor layers 302 to 305.

Further, after the formation of the semiconductor layers 302 to 305, a minute amount of impurity element (boron or phosphorus) may be doped to control a threshold value of the TFT.

Besides, in the case where the crystalline semiconductor film is manufactured by the laser crystallization method, a pulse oscillation type or continuous emission type excimer laser, YAG laser, or $YVO_4$ laser may be used. In the case where those lasers are used, it is appropriate to use a method in which laser light radiated from a laser oscillator is condensed into a linear shape by an optical system, and is irradiated to the semiconductor film. Although the conditions of crystallization should be properly selected by an operator, in the case where the excimer laser is used, a pulse oscillation frequency is set to 30 Hz, and a laser energy density is set to 100 to 400 $mJ/cm^2$ (typically 200 to 300 $mJ/cm^2$). In the case where the YAG laser is used, it is appropriate to set a pulse oscillation frequency as 1 to 10 Hz using the second harmonic, and to set a laser energy density to 300 to 600 $mJ/cm^2$ (typically, 350 to 500 $mJ/cm^2$). Then, laser light condensed into a linear shape with a width of 100 to 1000 μm, for example, 400 μm, is irradiated to the whole surface of the substrate, and an overlapping ratio (overlap ratio) of the linear laser light at this time may be set to 50 to 90%.

A gate insulating film 306 is then formed for covering the semiconductor layers 302 to 305. The gate insulating film 306 is formed of an insulating film containing silicon with a thickness of 40 to 150 nm by a plasma CVD or sputtering method. In this embodiment, the gate insulating film 306 is formed of a silicon oxynitride film with a thickness of 110 nm by the plasma CVD method (composition ratio Si=32%, O=59%, N=7%, and H=2%). Of course, the gate insulating film is not limited to the silicon oxynitride film, and other insulating films containing silicon may be used with a single layer or a lamination structure.

Besides, when a silicon oxide film is used, it can be formed such that TEOS (tetraethyl orthosilicate) and $O_2$ are mixed by the plasma CVD method with a reaction pressure of 40 Pa and a substrate temperature of 300 to 400° C., and discharged at a high frequency (13.56 MHz) power density of 0.5 to 0.8 W/cm$^2$. The silicon oxide film thus manufactured can obtain satisfactory characteristics as the gate insulating film by subsequent thermal annealing at 400 to 500° C.

Figure 14A:
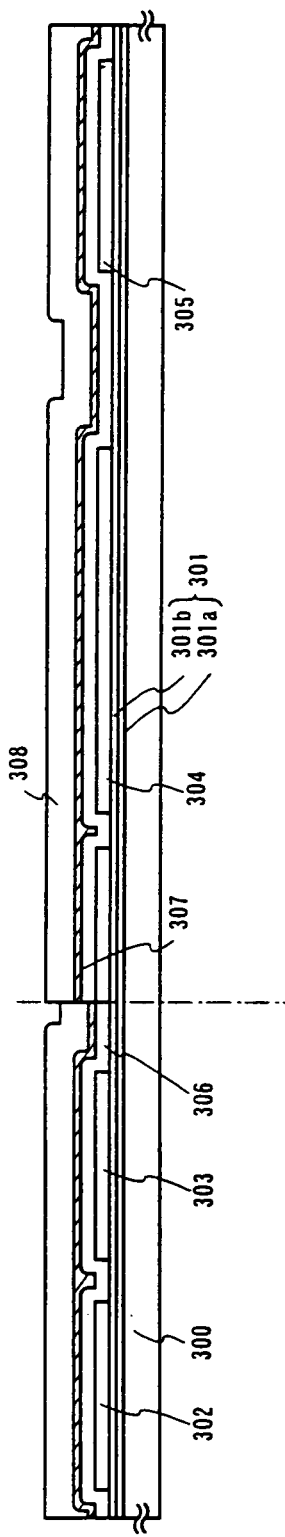
FIGS. 14A to 14C are diagrams showing a process of manufacturing an EL display device according to the present invention.

Then, as shown in FIG. 14A, a first conductive film 307 of 20 to 100 nm thickness and a second conductive film 308 of 100 to 400 nm thickness are formed into lamination on the gate insulating film 306. In this embodiment, the first conductive film 307 made of a TaN film with a thickness of 30 nm and the second conductive film 308 made of a W film with a thickness of 370 nm are formed into lamination. The TaN film is formed by sputtering with a Ta target under a nitrogen containing atmosphere. Besides, the W film is formed by sputtering with a W target. The W film may also be formed by a thermal CVD method using tungsten hexafluoride ($WF_6$). Whichever method is used, it is necessary to make the material have low resistance for use as a gate electrode, and it is preferred that the resistivity of the W film is set to 20 μΩcm or less. It is possible to make the W film have low resistance by making the crystal grains large. However, in the case where many impurity elements such as oxygen are contained within the W film, crystallization is inhibited and the resistance becomes higher. Therefore, in this embodiment, the W film is formed by sputtering using a W target having a high purity of 99.9999%, and also by taking sufficient consideration so as to prevent impurities within the gas phase from mixing therein during the film formation, and thus, a resistivity of 9 to 20 μΩcm can be realized.

Note that, in this embodiment, the first conductive film 307 is made of TaN, and the second conductive film 308 is made of W, but the material is not particularly limited thereto, and either film may be formed from an element selected from the group consisting of Ta, W, Ti, Mo, Al, Cu, Cr, and Nd or an alloy material or a compound material containing the above element as its main constituent. Besides, a semiconductor film typified by a polycrystalline silicon film doped with an impurity element such as phosphorus may be used. An alloy made of Ag, Pd, and Cu may also be used. Further, any combination may be employed such as a combination in which the first conductive film is formed of a tantalum (Ta) film and the second conductive film is formed of a W film, a combination in which the first conductive film is formed of a titanium nitride (TiN) film and the second conductive film is formed of a W film, a combination in which the first conductive film is formed of a tantalum nitride (TaN) film and the second conductive film is formed of an Al film, or a combination in which the first conductive film is formed of a tantalum nitride (TaN) film and the second conductive film is formed of a Cu film.

Figure 14B:
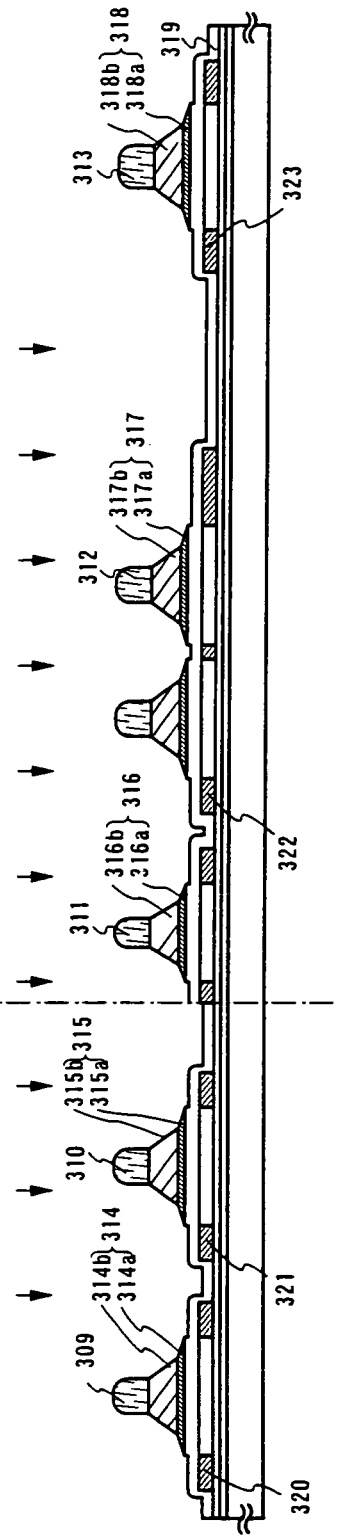

Next, as shown in FIG. 14B, masks 309 to 313 made of resist are formed by using a photolithography method, and a first etching process for forming electrodes and wirings is carried out. In the first etching process, first and second etching conditions are used. In this embodiment, as the first etching condition, an ICP (inductively coupled plasma) etching method is used, in which $CF_4$, $Cl_2$, and $O_2$ are used as etching gases, a gas flow rate is set to 25/25/10 sccm, and an RF (13.56 MHz) power of 500 W is applied to a coil shape electrode under a pressure of 1 Pa to generate plasma. Thus, the etching is performed. A dry etching device using ICP (Model E645-ICP) manufactured by Matsushita Electric Industrial Co. is used here. A 150 W RF (13.56 MHz) power is also applied to the substrate side (sample stage), thereby substantially applying a negative self-bias voltage. The W film is etched under the first etching condition, and the end portion of the first conductive layer is formed into a tapered shape. In the first etching condition, the etching rate for W is 200.39 nm/min, the etching rate for TaN is 80.32 nm/min, and the selectivity of W to TaN is about 2.5. Further, the taper angle of W is about 26° under the first etching condition.

Thereafter, as shown in FIG. 14B, the etching condition is changed into the second etching condition without removing the masks 309 to 313 made of resist, and the etching is performed for about 30 seconds, in which $CF_4$ and $Cl_2$ are used as the etching gases, a gas flow rate is set to 30/30 sccm, and an RF (13.56 MHz) power of 500 W is applied to a coil shape electrode under a pressure of 1 Pa to generate plasma. An RF (13.56 MHz) power of 20 W is also applied to the substrate side (sample stage), and a substantially negative self-bias voltage is applied thereto. In the second etching condition in which $CF_4$ and $Cl_2$ are mixed, the W film and the TaN film are etched to the same degree. In the second etching condition, the etching rate for W is 58.97 nm/min, and the etching rate for TaN is 66.43 nm/min. Note that, in order to perform the etching without leaving any residue on the gate insulating film, it is appropriate that an etching time is increased by approximately 10 to 20%.

In the above first etching process, by making the shapes of the masks formed of resist suitable, end portions of the first conductive layer and the second conductive layer become tapered shape by the effect of the bias voltage applied to the substrate side. The angle of the taper portion may be 15 to 45°. In this way, first shape conductive layers 314 to 318 consisting of the first conductive layer and the second conductive layer (first conductive layers 314a to 318a and second conductive layers 314b to 318b) are formed by the first etching process. Reference numeral 319 indicates a gate insulating film, and the regions not covered with the first shape conductive layers 314 to 318 are made thinner by approximately 20 to 50 nm by etching.

Then, a first doping process is performed to add an impurity element imparting n-type conductivity to the semiconductor layer without removing the masks made of resist (FIG. 14B). Doping may be carried out by an ion doping method or an ion injecting method. The condition of the ion doping method is that a dosage is $1\times10^{13}$ to $5\times10^{15}$ atoms/cm$^2$, and an acceleration voltage is 60 to 100 keV. In this embodiment, the dosage is $1.5\times10^{15}$ atoms/cm$^2$ and the acceleration voltage is 80 keV. As the impurity element imparting n-type conductivity, an element belonging to group 15 of the periodic table, typically phosphorus (P) or arsenic (As) is used, but phosphorus (P) is used here. In this case, the conductive layers 314 to 318 become masks for the impurity element imparting n-type conductivity, and high concentration impurity regions 320 to 323 are formed in a self-aligning manner. The impurity element imparting n-type conductivity in a concentration range of $1\times10^{20}$ to $1\times10^{21}$ atoms/cm$^3$ is added to the high concentration impurity regions 320 to 323.

Figure 14C:
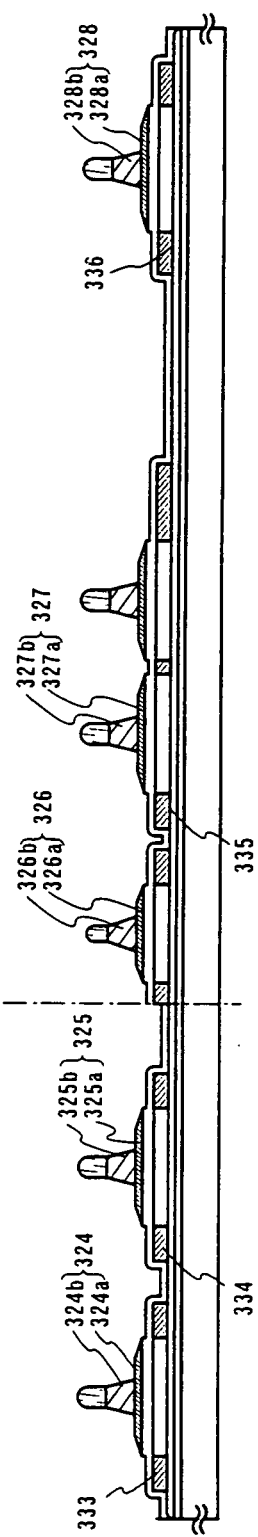
Figure 17:
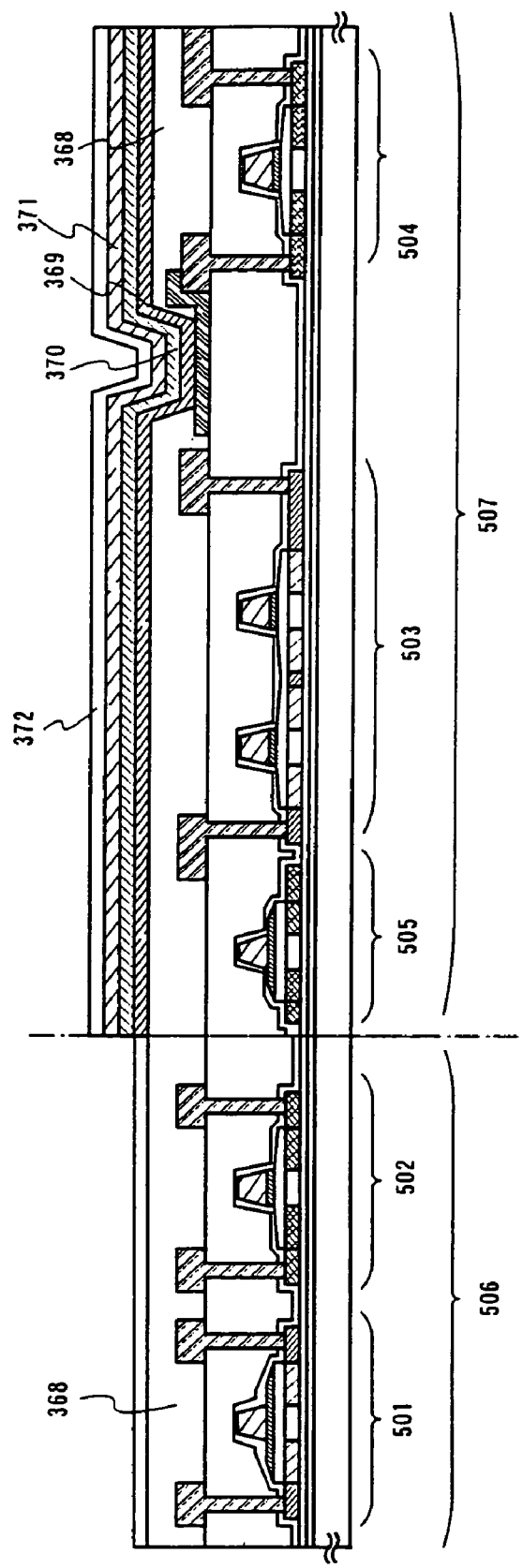
FIG. 17 is a diagram showing the process of manufacturing an EL display device according to the present invention.

Thereafter, as shown in FIG. 14C, a second etching process is performed without removing the masks made of resist. Here, a gas mixture of $CF_4$, $Cl_2$ and $O_2$ is used as an etching gas, the gas flow rate is set to 20/20/20 sccm, and a 500 W RF (13.56 MHz) power is applied to a coil shape electrode under a pressure of 1 Pa to generate plasma, thereby performing etching. A 20 W RF (13.56 MHz) power is also applied to the substrate side (sample stage), thereby substantially applying a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° by the second etching process. Second conductive layers 324b to 328b are formed by the second etching process. On the other hand, the first conductive layers 314a to 318a are hardly etched, and first conductive layers 324a to 328a are formed.

Next, as shown in FIG. 15A, a second doping process is performed. The second conductive layers 324b to 328b are used as masks for an impurity element, and doping is performed such that the impurity element is added to the semiconductor layer below the tapered portions of the first conductive layers. In this embodiment, phosphorus (P) is used as the impurity element, and plasma doping is performed with a dosage of $1.5\times10^{14}$ atoms/cm$^2$, a current density of 0.5 µA, and an acceleration voltage of 90 keV. Thus, low concentration impurity regions 329 to 333, which overlap with the first conductive layers, are formed in self-aligning manner. The concentration of phosphorus (P) added to the low concentration impurity regions 329 to 333 is $1\times10^{17}$ to $5\times10^{18}$ atoms/cm$^3$, and has a gentle concentration gradient in accordance with the film thickness of the tapered portions of the first conductive layers. Note that in the semiconductor layers that overlap with the tapered portions of the first conductive layers, the concentration of the impurity element slightly falls from the end portions of the tapered portions of the first conductive layers toward the inner portions, but the concentration keeps almost the same level. Further, an impurity element is added to the high concentration impurity regions 333 to 337 to form high concentration impurity regions 333 to 337.

Thereafter, as shown in FIG. 15B, after the masks made of resist are removed, a third etching process is performed using a photolithography method. The tapered portions of the first conductive layers are partially etched so as to have shapes overlapping the second conductive layers in the third etching process. Incidentally as shown in FIG. 15B, masks made of resist (338 and 339) are formed in the regions where the third etching process is not conducted.

The etching condition in the third etching process is that $Cl_2$ and $SF_6$ are used as etching gases, the gas flow rate is set to 10/50 sccm, and the ICP etching method is used as in the first and second etching processes. Note that, in the third etching process, the etching rate for TaN is 111.2 nm/min, and the etching rate for the gate insulating film is 12.8 nm/min.

In this embodiment, a 500 W RF (13.56 MHz) power is applied to a coil shape electrode under a pressure of 1.3 Pa to generate plasma, thereby performing etching. A 10 W RF (13.56 MHz) power is also applied to the substrate side (sample stage), thereby substantially applying a negative self-bias voltage. Thus, first conductive layers 340a to 342a are formed.

Impurity regions (LDD regions) 343 to 345, which do not overlap the first conductive layers 340a to 342a, are formed by the third etching process. Note that impurity regions (GOLD regions) 346 and 347 remains overlapping the first conductive layers 324a and 326a.

Further, the electrode constituted of the first conductive layer 324a and the second conductive layer 324b finally becomes the gate electrode of the n-channel TFT of the driver circuit, and the electrode constituted of the first conductive layer 340a and a second conductive layer 340b finally becomes the gate electrode of the p-channel TFT of the driver circuit.

Similarly, the electrode constituted of the first conductive layer 341a and a second conductive layer 341b finally becomes the gate electrode of the n-channel TFT of the pixel portion, and the electrode constituted of the first conductive layer 342a and a second conductive layer 342b finally becomes the gate electrode of the p-channel TFT of the pixel portion. Further, the electrode constituted of the first conductive layer 326a and the second conductive layer 326b finally becomes one of electrodes of a capacitor (storage capacitor) of the pixel portion.

In this way, in this embodiment, the impurity regions (LDD regions) 343 to 345 that do not overlap the first conductive layers 340a to 342a and the impurity regions (GOLD regions) 346 and 347 that overlap the first conductive layers 324a and 326a can be simultaneously formed. Thus, different impurity regions can be formed in accordance with the TFT characteristics.

Next, the gate insulating film 319 is subjected to an etching process. In this etching process, $CHF_3$ is used as an etching gas, and a reactive ion etching method (RIE method) is used. In this embodiment, a third etching process is conducted with a chamber pressure of 6.7 Pa, RF power of 800 W, and a gas flow rate of $CHF_3$ of 35 sccm.

Thus, parts of the high concentration impurity regions 333 to 337 are exposed, and insulating films 336a to 336e are formed.

Subsequently, after the masks made of resist are removed, masks 348 and 349 made of resist are newly formed to thereby perform a third doping process. By this third doping process, impurity regions 350 to 355 added with an impurity element imparting conductivity (p-type) opposite to the above conductivity (n-type) are formed in the semiconductor layers that become active layers of the p-channel TFT (FIG. 15C). The first conductive layers 340a, 326a, and 342a are used as masks for the impurity element, and the impurity element imparting p-type conductivity is added to form the impurity regions in a self-aligning manner.

In this embodiment, the impurity regions 350 to 355 are formed by an ion doping method using diborane ($B_2H_6$). Note that, in the third doping process, the semiconductor layers forming the n-channel TFTs are covered with the masks 348 and 349 made of resist. The impurity regions 350 to 355 are respectively added with phosphorous at different concentrations by the first doping process and the second doping process. In any of the regions, the doping process is conducted such that the concentration of the impurity element imparting p-type conductivity becomes $2\times10^{20}$ to $2\times10^{21}$ atoms/cm$^3$. Thus, the impurity regions function as source and drain regions of the p-channel TFT, and therefore, no problem occurs.

Through the above-described processes, the impurity regions are formed in the respective semiconductor layers.

Note that, in this embodiment, a method of conducting doping of the impurities (boron) after etching the gate insulating film is shown, but doping of the impurities may be conducted before etching the gate insulating film.

Subsequently, the masks 348 and 349 made of resist are removed, and as shown in FIG. 16A, a first interlayer insulating film 357 is formed. As the first interlayer insulating film 357, an insulating film containing silicon is formed with a thickness of 100 to 200 nm by a plasma CVD method or a sputtering method. In this embodiment, a silicon oxynitride film of 150 nm thickness is formed by the plasma CVD method. Of course, the first interlayer insulating film 357 is not limited to the silicon oxynitride film, and other insulating films containing silicon may be used in a single layer or a lamination structure.

Then, a process of activating the impurity element added to the semiconductor layers is performed. This activation process is performed by a thermal annealing method using an annealing furnace. The thermal annealing method may be performed in a nitrogen atmosphere with an oxygen concentration of 1 ppm or less, preferably 0.1 ppm or less and at 400 to 700° C., typically 500 to 550° C. In this embodiment, the activation process is conducted by a heat treatment for 4 hours at 550° C. Note that, in addition to the thermal annealing method, a laser annealing method or a rapid thermal annealing method (RTA method) can be applied.

Note that, in this embodiment, with the activation process, nickel used as a catalyst in crystallization is gettered to the impurity regions containing phosphorous at high concentration, and the nickel concentration in the semiconductor layer that becomes a channel forming region is mainly reduced. The TFT thus manufactured having the channel forming region has the lowered off current value and good crystallinity to obtain a high electric field effect mobility. Thus, the satisfactory characteristics can be attained.

Further, the activation process may be conducted before the formation of the first interlayer insulating film. Incidentally, in the case where the used wiring material is weak to heat, the activation process is preferably conducted after the formation of the interlayer insulating film (insulating film containing silicon as its main constituent for example, silicon nitride film) in order to protect wirings and the like as in this embodiment.

Furthermore, after the activation process and the doping process, the first interlayer insulating film may be formed.

Moreover, a heat treatment is carried out at 300 to 550° C. for 1 to 12 hours in an atmosphere containing hydrogen of 3 to 100% to perform a process of hydrogenating the semiconductor layers. In this embodiment, the heat treatment is conducted at 410° C. for 1 hour in a nitrogen atmosphere containing hydrogen of approximately 3%. This is a process of terminating dangling bonds in the semiconductor layer by hydrogen included in the interlayer insulating film. As another means for hydrogenation, plasma hydrogenation (using hydrogen excited by plasma) may be performed.

In addition, in the case where the laser annealing method is used as the activation process, after the hydrogenation process, laser light emitted from an excimer laser, a YAG laser or the like is desirably irradiated.

Next, as shown in FIG. 16B, a second interlayer insulating film 358, which is made from an organic insulating material, is formed on the first interlayer insulating film 357. In this embodiment, an acrylic resin film is formed with a thickness of 1.6 μm. Then, patterning for forming contact holes that reach the respective impurity regions 333, 336, 350 and 352 is conducted.

As the second interlayer insulating film 358, a film made from an insulating material containing silicon or an organic resin is used. As the insulating material containing silicon, silicon oxide, silicon nitride, or silicon oxynitride may be used. As the organic resin, polyimide, polyamide, acrylic, BCB (benzocyclobutene), or the like may be used.

In this embodiment, the silicon oxynitride film formed by a plasma CVD method is formed. Note that the thickness of the silicon oxynitride film is preferably 1 to 5 μm (more preferably 2 to 4 μm). The silicon oxynitride film has a little amount of moisture contained in the film itself, and thus, is effective in suppressing deterioration of the EL element.

Further, dry etching or wet etching may be used for the formation of the contact holes. However, taking the problem of electrostatic destruction in etching into consideration, the wet etching method is desirably used.

Moreover, in the formation of the contact holes here, the first interlayer insulating film and the second interlayer insulating film are etched at the same time. Thus, in consideration for the shape of the contact hole, it is preferable that the material with an etching speed faster than that of the material for forming the first interlayer insulating film is used for the material for forming the second interlayer insulating film.

Then, wirings 359 to 366, which are electrically connected with the impurity regions 333, 336, 350, and 352, respectively, are formed. The wirings are formed by patterning a lamination film of a Ti film of 50 nm thickness and an alloy film (alloy film of Al and Ti) of 500 nm thickness, but other conductive films may also be used.

Subsequently, a transparent conductive film is formed thereon with a thickness of 80 to 120 nm, and by patterning the transparent conductive film, a transparent electrode 367 is formed (FIG. 16B).

Note that, in this embodiment, an indium tin oxide (ITO) film or a transparent conductive film in which indium oxide is mixed with zinc oxide (ZnO) of 2 to 20% is used as the transparent electrode.

Further, the transparent electrode 367 is formed so as to contact and overlap the drain wiring 365, thereby having electrical connection with a drain region of an EL driver TFT.

Next, as shown in FIG. 17A, an insulating film containing silicon (a silicon oxide film in this embodiment) is formed with a thickness of 500 nm, and an opening portion is formed at the position corresponding to the transparent electrode 367 to thereby form a third interlayer insulating film 368 functioning as a bank. In forming the opening portion, sidewalls with a tapered shape may easily be formed by using the wet etching method. If the sidewalls of the opening portion are not sufficiently gentle, the deterioration of the EL layer caused by a step becomes a marked problem. Thus, attention is required.

Note that, in this embodiment, the silicon oxide film is used as the third interlayer insulating film, but depending on the situation, an organic resin film made of polyimide, polyamide, acrylic, or BCB (benzocyclobutene) may also be used.

Subsequently, as shown in FIG. 17A, an EL layer 369 is formed by an evaporation method, and further, a cathode (MgAg electrode) 370 and a protective electrode 371 are formed by the evaporation method. At this time, before the formation of the EL layer 369 and the cathode 370, it is desirable that the transparent electrode 367 is subjected to a heat treatment to completely remove moisture. Note that the MgAg electrode is used as the cathode of the EL element in this embodiment, but other known materials may also be used.

Note that a known material may be used for the EL layer 369. In this embodiment, the EL layer adopts a two-layer structure constituted of a hole transporting layer and a light emitting layer. However, there may be the case where a hole transporting layer, a hole injecting layer, an electron injecting layer or an electron transporting layer is provided. Various examples of the combination have already been reported, and any structure of those may be used.

In this embodiment, polyphenylene vinylene is formed by the evaporation method as the hole transporting layer. Further, as the light emitting layer, a material in which 1, 3, 4-oxydiazole derivative PBD of 30 to 40% is distributed in polyvinyl carbazole is formed by the evaporation method, and coumarin 6 of approximately 1% is added as a center of green color light emission.

Further, the EL layer 369 can be protected from moisture or oxygen by the protective electrode 371, but a passivation film 372 is preferably formed. In this embodiment, a silicon nitride film of 300 nm thickness is provided as the passivation film 372. This passivation film may also be formed in succession after the formation of the protective electrode 371 without exposure to an atmosphere.

Moreover, the protective electrode 371 is provided to prevent deterioration of the cathode 370, and is typified by a metal film containing aluminum as its main constituent. Of course, other materials may also be used. Further, the EL layer 369 and the cathode 370 are very weak to moisture. Thus, it is preferable that continuous formation is conducted up through the formation of the protective electrode 371 without exposure to an atmosphere to protect the EL layer from the outside air.

Note that it is appropriate that the thickness of the EL layer 369 is 10 to 400 nm (typically 60 to 150 nm) and the thickness of the cathode 370 is 80 to 200 nm (typically 100 to 150 nm).

Thus, an EL module with the structure shown in FIG. 17A is completed. Note that, in a process of manufacturing an EL module in this embodiment, a source signal line is formed from Ta and W, which are materials forming the gate electrode, and a gate signal line is formed from Al that is a wiring material forming the source and drain electrodes, in connection with the circuit structure and the process. However, different materials may also be used.

Further, a driver circuit 506 having an n-channel TFT 501 and a p-channel TFT 502 and a pixel portion 507 having a switching TFT 503, an EL driver TFT 504, and a capacitor 505 can be formed on the same substrate.

Note that, in this embodiment, a structure in which the n-channel TFT and the p-channel TFT are used as the switching TFT 503 and the EL driver TFT 504, respectively, is shown since the outgoing from a lower surface is adopted in accordance with the structure of the EL element. However, this embodiment is only one preferred embodiment, and the present invention is not necessarily limited to this.

The n-channel TFT 501 of the driver circuit 506 has the channel forming region 381, the low concentration impurity region 329 (GOLD region) that overlaps the first conductive layer 324a constituting a part of the gate electrode, and the high concentration impurity region 333 functioning as the source or drain region. The p-channel TFT 502 has a channel forming region 382, the impurity region 353 that does not overlap the first conductive layer 340a constituting a part of the gate electrode, and the impurity region 350 functioning as the source or drain region.

The switching TFT 503 of the pixel portion 507 has a channel forming portion 383, the low concentration impurity region 344 (LDD region), which does not overlap the first conductive layer 341a forming the gate electrode and which is formed outside the gate electrode, and the high concentration impurity region 336 functioning as the source or drain region.

The EL driver TFT 504 of the pixel portion 507 has a channel forming region 384, and the high concentration impurity regions 352 and 355 functioning as the source or drain region. Further, the capacitor 505 is formed such that the first conductive layer 326a and the second conductive layer 326b function as one of the electrodes.

Note that, in this embodiment, although a structure in which the cathode is formed after the EL layer is formed on the pixel electrode (anode), a structure in which the EL layer and the anode are formed on the pixel electrode (cathode) may be adopted. Incidentally, in this case, different from the outgoing from a lower surface described above, the outgoing from an upper surface is adopted. Furthermore, at this time, it is desirable that the EL driver TFT 504 is formed of the n-channel TFT.

This embodiment can be implemented by freely combined with the structure of Embodiments 1 to 3.

Embodiment 5

Figure 13A:
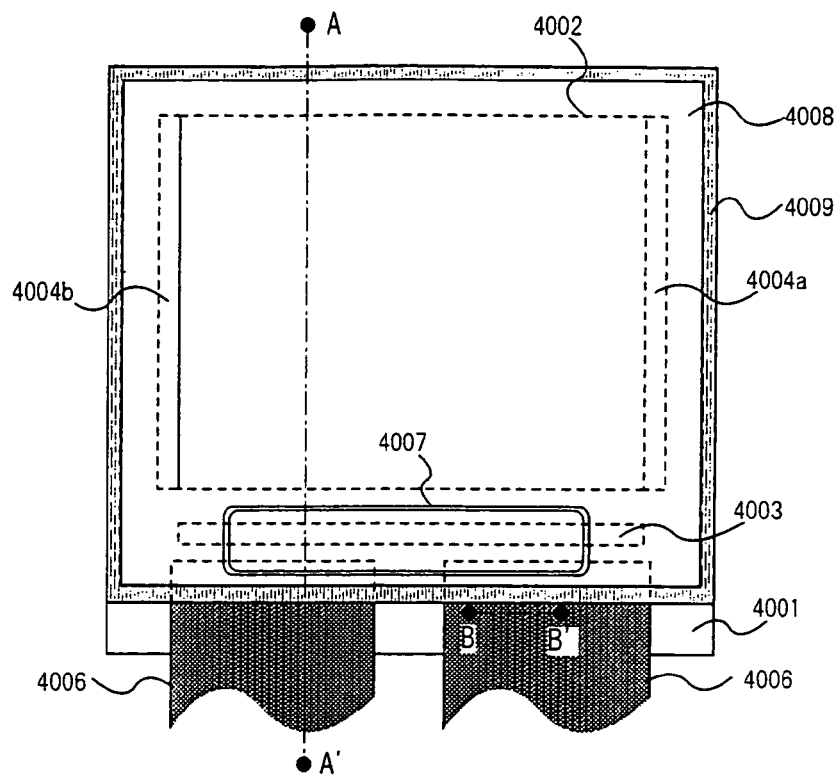
FIG. 13A is a top view of the EL display device according to the present invention and FIGS. 13B and 13C are sectional views thereof.
Figure 13B:
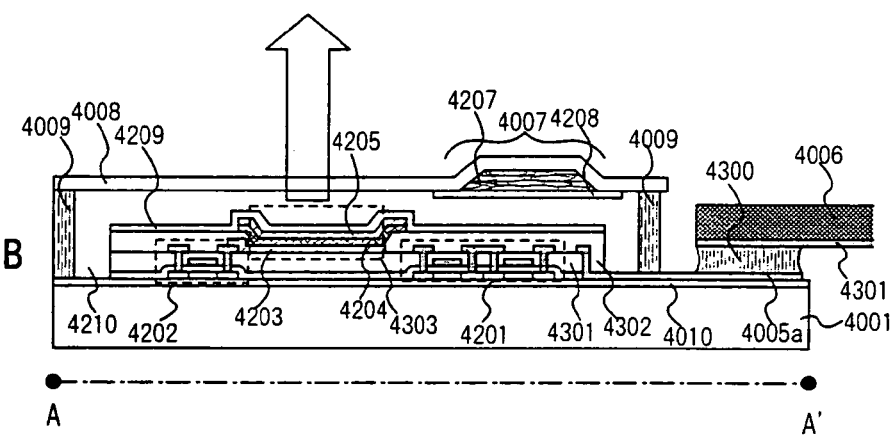
Figure 13C:
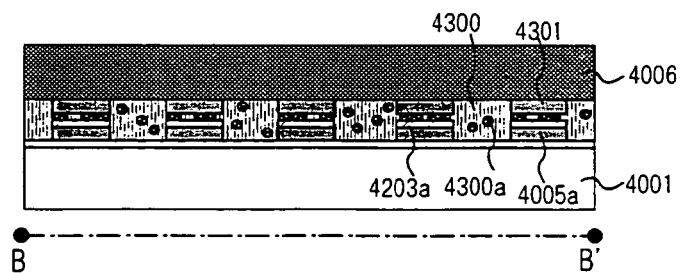

This embodiment describes with reference to FIGS. 13A to 13C a case of manufacturing an EL display device using the present invention.

FIG. 13A is a top view of an EL display device in which a sealing member is used in sealing. FIG. 13B is a sectional view taken along the line A-A' in FIG. 13A. FIG. 13C is a sectional view taken along the line B-B' in FIG. 13A.

A pixel portion 4002, a source signal line driving circuit 4003, and first and second gate signal line driving circuits 4004a and 4004b are formed on a substrate 4001. A seal member 4009 is placed so as to surround them all on the substrate. A sealing member 4008 is provided on the pixel portion 4002, the source signal line driving circuit 4003, and the first and second gate signal line driving circuits 4004a and 4004b. Accordingly, the pixel portion 4002, the source signal line driving circuit 4003, and the first and second gate signal line driving circuits 4004a and 4004b are sealed in the space defined by the substrate 4001, the seal member 4009, and the sealing member 4008, with a filler 4210 filling the space.

The pixel portion 4002, the source signal line driving circuit 4003, and the first and second gate signal line driving circuits 4004a and 4004b on the substrate 4001 each have a plurality of TFTs. FIG. 13B shows as representatives of these TFTs a driving TFT (composed of an n-channel TFT and a p-channel TFT in FIG. 13B) 4201 included in the source signal line driving circuit 4003 and an EL driving TFT 4202 included in the pixel portion 4002. The TFTs 4201 and 4202 are formed on a base film 4010.

In this embodiment, the n-channel TFT and the p-channel TFT that constitute the driving TFT 4201 are manufactured by a known method, and a p-channel TFT manufactured by a known method is used for the EL driving TFT 4202. The pixel portion 4002 is provided with a capacitor storage (not shown) connected to a gate of the EL driving TFT 4202.

Formed on the driving TFT 4201 and the EL driving TFT 4202 is an interlayer insulating film (planarization film) 4301, on which a pixel electrode (anode) 4203 is formed to be electrically connected to a drain of the EL driving TFT 4202. The pixel electrode 4203 is formed of a transparent conductive film having a large work function. Examples of the usable transparent conductive film material include a compound of indium oxide and tin oxide, a compound of indium oxide and zinc oxide, zinc oxide alone, tin oxide alone, and indium oxide alone. A transparent conductive film formed of one of these materials and doped with gallium may also be used for the pixel electrode.

An insulating film 4302 is formed on the pixel electrode 4203. An opening is formed in the insulating film 4302 above the pixel electrode 4203. At the opening above the pixel electrode 4203, an EL (electroluminescence) layer 4204 is formed. The EL layer 4204 is formed of a known organic EL material or inorganic EL material. Either low molecular weight (monomer) organic EL materials or high molecular weight (polymer) organic EL materials can be used for the EL layer.

The EL layer 4204 is formed by a known evaporation technique or application technique. The EL layer may consist only of a light emitting layer. Alternatively, the EL layer may be a laminate having, in addition to a light emitting layer, a hole injection layer, a hole transporting layer, an electron transporting layer, and an electron injection layer in any combination.

A cathode 4205 is formed on the EL layer 4204 from a light-shielding conductive film (typically, a conductive film mainly containing aluminum, copper, or silver, or a laminate consisting of the above conductive film and other conductive films). Desirably, moisture and oxygen are removed as much as possible from the interface between the cathode 4205 and the EL layer 4204. Some contrivance is needed for the removal. For example, the EL layer 4204 is formed in a nitrogen or rare gas atmosphere and then the cathode 4205 is successively formed without exposing the substrate to moisture and oxygen. This embodiment uses a multi-chamber system (cluster tool system) film formation apparatus to achieve the film formation as described above. The cathode 4205 receives a given voltage.

An EL element 4303 composed of the pixel electrode (anode) 4203, the EL layer 4204, and the cathode 4205 is thus formed. A protective film 4209 is formed on the insulating film 4302 so as to cover the EL element 4303. The protective film 4209 is effective in preventing oxygen and moisture from entering the EL element 4303.

Denoted by 4005*a* is a lead-out wiring line connected to a power supply line, and is electrically connected to a source region of the EL driving TFT 4202. The lead-out wiring line 4005*a* runs between the seal member 4009 and the substrate 4001 and is electrically connected to an FPC wiring line 4301 of an FPC 4006 through an anisotropic conductive film 4300.

The sealing member 4008 is formed of a glass material, a metal material (typically a stainless steel material), a ceramic material, or a plastic material (including a plastic film). Examples of the usable plastic material include an FRP (fiberglass-reinforced plastic) plate, a PVF (polyvinyl fluoride) film, a Mylar film, a polyester film, and an acrylic resin film. A sheet obtained by sandwiching an aluminum foil between PVF films or Mylar films may also be used.

However, if light emitted from the EL element travels toward the covering member side, the covering member has to be transparent. In this case, a transparent material such as a glass plate, a plastic plate, a polyester film, or an acrylic film is used.

The filler 4210 may be inert gas such as nitrogen and argon, or a UV-curable resin or a thermally curable resin. Examples of the usable resin include PVC (polyvinyl chloride), acrylic, polyimide, an epoxy resin, a silicone resin, PVB (polyvinyl butylal), and EVA (ethylene vinyl acetate). In this embodiment, nitrogen is used as the filler.

In order to expose the filler 4210 to a hygroscopic substance (preferably, barium oxide) or a substance capable of adsorbing oxygen, a hygroscopic substance 4207, or a substance 4207 capable of adsorbing oxygen, is placed in a concave portion 4007 formed on a surface of the sealing member 4008 on the substrate 4001 side. The hygroscopic substance 4207, or a substance 4207 capable of adsorbing oxygen, is held down to the concave portion 4007 by a concave portion covering member 4208 to prevent hygroscopic substance 4207, or a substance 4207 capable of adsorbing oxygen, from scattering. The concave portion covering member 4208 is a dense mesh and allows air and moisture to pass but not the hygroscopic substance 4207, or a substance 4207 capable of adsorbing oxygen. The hygroscopic substance 4207, or a substance 4207 capable of adsorbing oxygen, can prevent degradation of the EL element 4303.

As shown in FIG. 13C, a conductive film 4203*a* is formed to be brought into contact with the top face of the lead-out wiring line 4005*a* at the same time the pixel electrode 4203 is formed.

The anisotropic film 4300 has a conductive filler 4300*a*. The conductive filler 4300*a* electrically connects the conductive film 4203*a* on the substrate 4001 to the FPC wiring line 4301 on the FPC 4006 upon a thermal press fitting of the substrate 4001 and the FPC 4006.

This embodiment can be combined with any of Embodiments 1 through 4.

Embodiment 6

In this embodiment, an external light emitting quantum efficiency can be remarkably improved by using an EL material by which phosphorescence from a triplet exciton can be employed for emitting a light As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical Formula 1)

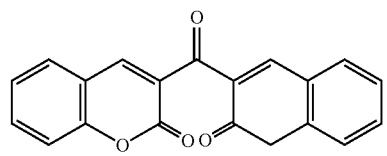

(M. A. Baldo, D. F. O'Brien, Y. You, A. Shoustikov, S. Sibley, M. E. Thompson, S. R. Forrest, Nature 395 (1998) p.151)

The molecular formula of an EL material (Pt complex) reported by the above article is represented as follows.

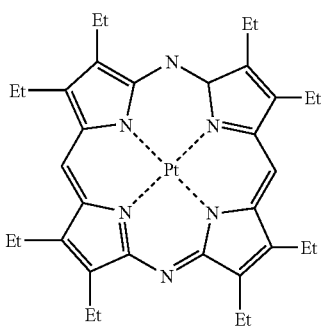

(Chemical Formula 2)

(M. A. Baldo, S. Lamansky, P. E. Burrows, M. E. Thompson, S. R. Forrest, Appl. Phys. Lett., 75 (1999) p.4.)

(T. Tsutsui, M. J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

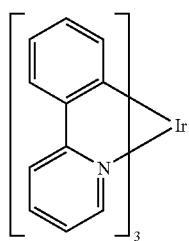

(Chemical formula 3)

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiments 1 to 5.

Embodiment 7

This embodiment will be described on electronic devices incorporated a display device as a display medium, which is formed by using the present invention.

As these electronic devices, there can be enumerated a video camera, a digital camera, a head-mountable display, a game machine, a car navigation, a personal computer, and a mobile information terminal (e.g., a mobile computer, a mobile telephone or an electronic book), as shown in FIGS. 18A to 18E.

Figure 18A:
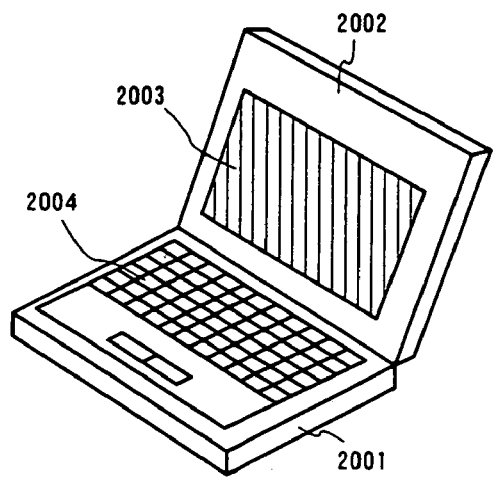
FIGS. 18A to 18E are diagrams showing electronic equipment employing an EL display device of the present invention.

FIG. 18A shows a personal computer including a body 2001, a casing 2002, a display portion 2003 and a keyboard 2004. The display device of the present invention can be used as the display portion 2003 of the personal computer.

Figure 18B:
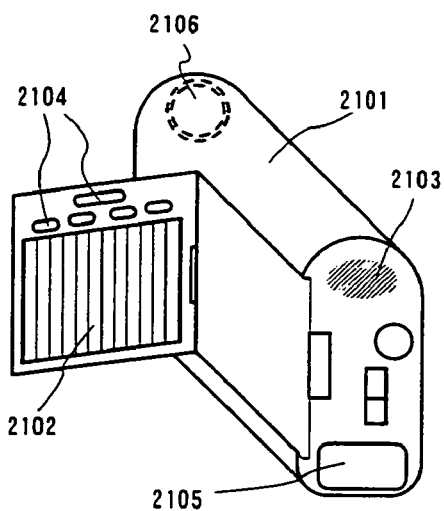

FIG. 18B shows a video camera including a body 2101, a display portion 2102, a voice input unit 2103, manipulation switches 2104, a battery 2105 and an image receiving unit 2106. The display device of the present invention can be used as the display portion 2102 of the video camera.

Figure 18C:
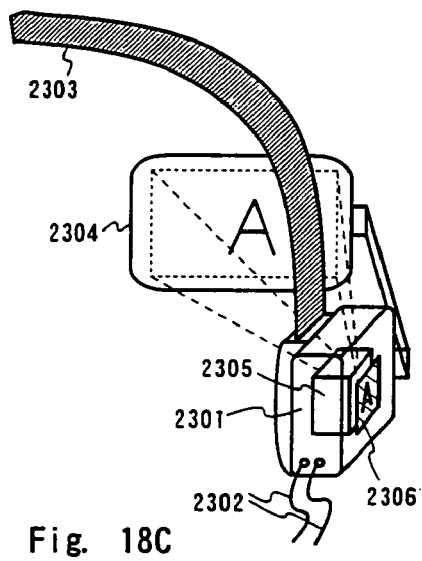

FIG. 18C shows one portion (i.e., a right-hand side) of a head-mounted display including a body 2301, a signal cable 2302, a head fixing band 2303, a display unit 2304, an optical system 2305 and a display portion 2306. The display device of the present invention can be used the display portion 2306 of the head-mounted display.

Figure 18D:
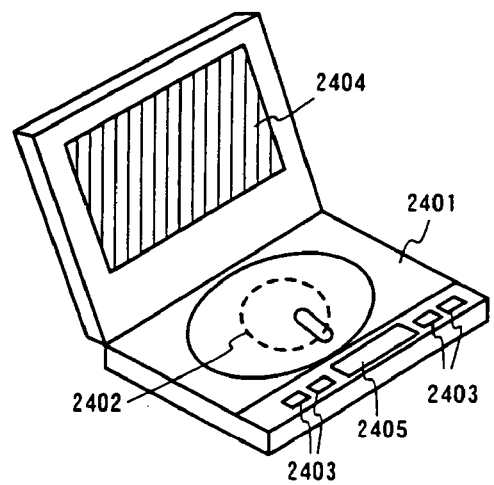

FIG. 18D shows an image reproducing device (e.g., a DVD reproducing device) provided with a recording medium. The image reproducing device includes a body 2401, a recording medium (CD, LD or DVD and the like) 2402, manipulation switches 2403 and display units (a) 2404 and (b) 2405. The display portion 2404 (a) displays an image information and the display portion (b) 2405 displays character information. The display device using a driving method of the present invention can be used the display portions (a) 2404 and (b) 2405. Here, this device is enabled to CD reproduction device and the game device as an image reproduction device incorporating the recording medium.

Figure 18E:
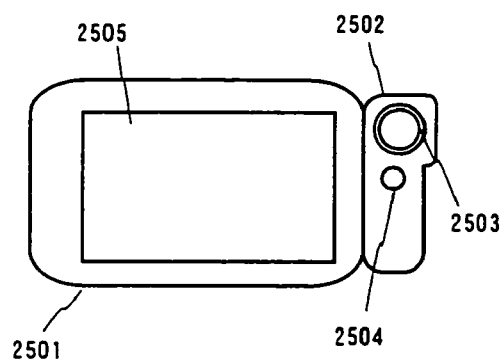

FIG. 18E shows a mobile computer including a body 2501, a camera portion 2502, a image receiving unit 2503, an operation switch 2504 and a display portion 2505. The display device of the present invention can be used as the display portion 2505 of the mobile computer.

As has been described hereinbefore, the invention can have an extremely wide range of applications and can be applied to electronic devices of any fields. On the other hand, the electronic device of this embodiment can be realized by using a construction of any of the combinations of Embodiments 1 to 6.

Conventionally, it has been difficult to obtain accurate gray scales because a current inputted to an EL element does not correspond to the signal electric potential of a video signal linearly.

With the above structure, the present invention can cause an EL element to emit light at a luminance linearly corresponding to the signal electric potential of a video signal. The present invention thus provides a display device that is easy to obtain accurate gray scale display.

What is claimed is:

1. A digital camera having a display device, the display device comprising:
    an EL element having a first electrode, a second electrode, and an EL layer that is interposed between the first electrode and the second electrode;
    a first TFT;
    a second TFT having the same polarity as the first TFT, the second TFT including a gate electrode and a drain region that are connected to each other; and
    a power supply line connected to the first electrode of the EL element through the first TFT, wherein the display device further comprises:
    means for setting a current linearly corresponding to the electric potential difference between the electric potential of the power supply line and the electric potential of a video signal as a drain current of the second TFT; and
    means for equalizing the gate voltage of the first TFT with the gate voltage of the second TFT.

2. A digital camera having a display device, the display device comprising:
    an EL element having a first electrode, a second electrode, and an EL layer that is interposed between the first electrode and the second electrode;
    a first TFT;
    a second TFT having the same polarity and the same threshold voltage as the first TFT, the second TFT including a gate electrode and a drain region that are connected to each other; and a power supply line connected to the first electrode of the EL element through the first TFT, wherein the display device further comprises:

means for setting a current linearly corresponding to the electric potential difference between the electric potential of the power supply line and the electric potential of a video signal as a drain current of the second TFT; and means for equalizing the gate voltage of the first TFT with the gate voltage of the second TFT.

3. A digital camera having a display device, the display device comprising:

an EL element having a first electrode, a second electrode, and an EL layer that is interposed between the first electrode and the second electrode;

a first TFT;

a signal line;

a switching element for selecting the connection between the signal line and a gate electrode of the first TFT;

a second TFT having the same polarity as the first TFT, the second TFT including a gate electrode and a drain region that are connected to each other; and a power supply line connected to the first electrode of the EL element through the first TFT, wherein the display device further comprises:

means for setting a current linearly corresponding to the electric potential difference between the electric potential of the power supply line and the electric potential of a video signal as a drain current of the second TFT;

means for equalizing the electric potential of a source region of the first TFT with the electric potential of a source region of the second TFT; and means for equalizing the electric potential of the signal line with the electric potential of the gate electrode of the second TFT.

4. A digital camera having a display device, the display device comprising:

an EL element having a first electrode, a second electrode, and an EL layer that is interposed between the first electrode and the second electrode;

a first TFT;

a second TFT;

a signal line connected to a gate electrode of the first TFT through the second TFT;

a third TFT having the same polarity as the first TFT, the third TFT including a gate electrode and a drain region that are connected to each other; and a power supply line connected to the first electrode of the EL element through the first TFT, wherein the display device further comprises:

means for setting a current linearly corresponding to the electric potential difference between the electric potential of the power supply line and the electric potential of a video signal as a drain current of the third TFT;

means for equalizing the electric potential of a source region of the first TFT with the electric potential of a source region of the third TFT; and means for equalizing the electric potential of the signal line with the electric potential of the gate electrode of the third TFT.

5. A digital camera having a display device, the display device comprising:

an EL element having a first electrode, a second electrode, and an EL layer that is interposed between the first electrode and the second electrode;

a first TFT having a drain region that is connected to the first electrode of the EL element;

a second TFT having the same polarity as the first TFT, the second TFT including a gate electrode and a drain region that are connected to each other;

a power supply line connected to a source region of the first TFT; and an operation amplifier having a non-inversion input terminal, an inversion input terminal, and an output terminal, the non-inversion input terminal being kept at an electric potential equal to the electric potential of the power supply line, the inversion input terminal being connected to a source region of the second TFT, and the output terminal being connected to the drain region of the second TFT, wherein the display device further comprises:

means for setting a current linearly corresponding to the electric potential difference between the electric potential of the power supply line and the electric potential of a video signal as a drain current of the second TFT; and means for equalizing the electric potential of a gate electrode of the first TFT with the electric potential of the gate electrode of the second TFT.

6. A digital camera having a display device, the display device comprising:

an EL element having a first electrode, a second electrode, and an EL layer that is interposed between the first electrode and the second electrode;

a first TFT having a drain region that is connected to the first electrode of the EL element;

a signal line;

a switching element for selecting the connection between the signal line and a gate electrode of the first TFT;

a second TFT having the same polarity as the first TFT, the second TFT including a gate electrode and a drain region that are connected to each other;

a power supply line connected to a source region of the first TFT; and an operation amplifier having a non-inversion input terminal, an inversion input terminal, and an output terminal, the non-inversion input terminal being kept at an electric potential equal to the electric potential of the power supply line, the inversion input terminal being connected to a source region of the second TFT, and the output terminal being connected to the drain region of the second TFT, wherein the display device further comprises:

means for setting a current linearly corresponding to the electric potential difference between the electric potential of the power supply line and the electric potential of a video signal as a drain current of the second TFT; and means for equalizing the electric potential of the signal line with the electric potential of the gate electrode of the second TFT.

7. A digital camera having a display device, the display device comprising:

an EL element having a first electrode, a second electrode, and an EL layer that is interposed between the first electrode and the second electrode;

a first TFT having a drain region that is connected to the first electrode of the EL element;

a second TFT;

a signal line connected to a gate electrode of the first TFT through the second TFT;

a third TFT having the same polarity as the first TFT, the third TFT including a gate electrode and a drain region that are connected to each other; and a power supply line connected to a source region of the first TFT; and an operation amplifier having a non-inversion input terminal, an inversion input terminal, and an output terminal, the non-inversion input terminal being kept at an electric potential equal to the electric potential of the power supply line, the inversion input terminal being connected to a source region of the third TFT, and the output terminal being connected to the drain region of the third TFT, wherein the display device further comprises:

means for setting a current linearly corresponding to the electric potential difference between the electric potential of the power supply line and the electric potential of a video signal as a drain current of the third TFT; and means for equalizing the electric potential of the signal line with the electric potential of the gate electrode of the third TFT.

8. A digital camera having a display device, the display device comprising:

an EL element having a first electrode, a second electrode, and an EL layer that is interposed between the first electrode and the second electrode;

a first TFT having a drain region that is connected to the first electrode of the EL element;

a second TFT having the same polarity as the first TFT, the second TFT including a gate electrode and a drain region that are connected to each other;

a power supply line connected to a source region of the first TFT;

an operation amplifier having a non-inversion input terminal, an inversion input terminal, and an output terminal, the non-inversion input terminal being kept at an electric potential equal to the electric potential of the power supply line, the inversion input terminal being connected to a source region of the second TFT, and the output terminal being connected to the drain region of the second TFT; and a resistor having a first terminal to which the electric potential of a video signal is inputted and a second terminal connected to the inversion input terminal of the operation amplifier, wherein the display device further comprises means for equalizing the electric potential of a gate electrode of the first TFT with the electric potential of the gate electrode of the second TFT.

\* \* \* \* \*